US 8,766,255 B2
Jul. 1, 2014

(12) United States Patent
Isobe et al.

(10) Patent No.: US 8,766,255 B2
(45) Date of Patent: Jul. 1, 2014

(54) OXIDE SEMICONDUCTOR DEVICE INCLUDING GATE TRENCH AND ISOLATION TRENCH

(75) Inventors: Atsuo Isobe, Kanagawa (JP); Toshihiko Saito, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/418,558

(22) Filed: Mar. 13, 2012

(65) Prior Publication Data
US 2012/0235150 A1    Sep. 20, 2012

(30) Foreign Application Priority Data

Mar. 16, 2011    (JP) ................... 2011-058341

(51) Int. Cl.
*H01L 29/786*    (2006.01)
(52) U.S. Cl.
USPC ............ 257/43; 257/57; 257/66; 257/71; 257/296; 257/622; 257/288; 257/E29.273; 257/E29.295; 438/151; 438/152
(58) Field of Classification Search
CPC combination set(s) only.
See application file for complete search history.

(56) References Cited

U.S. PATENT DOCUMENTS

| | | | |
|---|---|---|---|
| 4,466,081 A | | 8/1984 | Masuoka |
| 5,317,432 A | * | 5/1994 | Ino ................................ 349/39 |
| 5,407,846 A | * | 4/1995 | Chan ............................ 438/156 |
| 5,508,531 A | * | 4/1996 | Ha .................................. 257/57 |
| 5,612,563 A | | 3/1997 | Fitch et al. |
| 5,731,856 A | | 3/1998 | Kim et al. |
| 5,744,864 A | | 4/1998 | Cillessen et al. |
| 5,840,601 A | * | 11/1998 | Cho ............................... 438/151 |
| 6,294,274 B1 | | 9/2001 | Kawazoe et al. |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

Orita, M et al., "Mechanism of Electrical Conductivity of Transparent InGaZnO4," Phys. Rev. B (Physical Review. B), Jan. 15, 2000, vol. 61, No. 3, pp. 1811-1816.

(Continued)

*Primary Examiner* — Julio J Maldonado
*Assistant Examiner* — Molly Reida
(74) *Attorney, Agent, or Firm* — Fish & Richardson P.C.

(57) ABSTRACT

A semiconductor device in which improvement of a property of holding stored data can be achieved. Further, power consumption of a semiconductor device is reduced. A transistor in which a wide-gap semiconductor material capable of sufficiently reducing the off-state current of a transistor (e.g., an oxide semiconductor material) in a channel formation region is used and which has a trench structure, i.e., a trench for a gate electrode and a trench for element isolation, is provided. The use of a semiconductor material capable of sufficiently reducing the off-state current of a transistor enables data to be held for a long time. Further, since the transistor has the trench for a gate electrode, the occurrence of a short-channel effect can be suppressed by appropriately setting the depth of the trench even when the distance between the source electrode and the drain electrode is decreased.

22 Claims, 15 Drawing Sheets

(56) References Cited

U.S. PATENT DOCUMENTS

| | | | |
|---|---|---|---|
| 6,563,174 B2 | 5/2003 | Kawasaki et al. | |
| 6,690,598 B2 | 2/2004 | Oguchi et al. | |
| 6,720,617 B2* | 4/2004 | Einav | 257/332 |
| 6,727,522 B1 | 4/2004 | Kawasaki et al. | |
| 6,791,863 B2 | 9/2004 | Oguchi et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,414,278 B2 | 8/2008 | Sugatani et al. | |
| 7,419,858 B2* | 9/2008 | Schuele et al. | 438/163 |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,389 B2 | 8/2009 | Tanaka | |
| 7,674,650 B2 | 3/2010 | Akimoto et al. | |
| 7,732,819 B2 | 6/2010 | Akimoto et al. | |
| 7,846,826 B2 | 12/2010 | Oyu et al. | |
| 7,872,309 B2* | 1/2011 | Schuele et al. | 257/344 |
| 7,893,494 B2 | 2/2011 | Chang et al. | |
| 8,084,331 B2 | 12/2011 | Ofuji et al. | |
| 2001/0046027 A1 | 11/2001 | Tai et al. | |
| 2002/0018357 A1 | 2/2002 | Oguchi et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0109341 A1 | 6/2004 | Oguchi et al. | |
| 2004/0127038 A1 | 7/2004 | Carcia et al. | |
| 2004/0232408 A1 | 11/2004 | Heeger et al. | |
| 2005/0017302 A1 | 1/2005 | Hoffman | |
| 2005/0199959 A1 | 9/2005 | Chiang et al. | |
| 2006/0022242 A1 | 2/2006 | Sugatani et al. | |
| 2006/0035452 A1 | 2/2006 | Carcia et al. | |
| 2006/0043377 A1 | 3/2006 | Hoffman et al. | |
| 2006/0084255 A1 | 4/2006 | Oyu et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0214239 A1* | 9/2006 | Shimada | 257/401 |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0278540 A1 | 12/2007 | Hoshino et al. | |
| 2007/0287296 A1 | 12/2007 | Chang | |
| 2007/0296031 A1 | 12/2007 | Tanaka | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0256237 A1 | 10/2009 | Kobayashi | |
| 2009/0278122 A1 | 11/2009 | Hosono et al. | |
| 2009/0280600 A1 | 11/2009 | Hosono et al. | |
| 2009/0315138 A1 | 12/2009 | Chang et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0159639 A1 | 6/2010 | Sakata | |
| 2011/0092016 A1 | 4/2011 | Ofuji et al. | |
| 2012/0187410 A1* | 7/2012 | Yamazaki et al. | 257/66 |
| 2012/0187417 A1 | 7/2012 | Yamazaki et al. | |
| 2012/0187475 A1 | 7/2012 | Yamazaki et al. | |

FOREIGN PATENT DOCUMENTS

| | | | |
|---|---|---|---|
| JP | 57-105889 A | 7/1982 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 05297413 A | 11/1993 | |
| JP | 08-264794 A | 10/1996 | |
| JP | 11-505377 A | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006049413 A | 2/2006 | |
| JP | 2008004738 A | 1/2008 | |
| WO | 2004/114391 A1 | 12/2004 | |

OTHER PUBLICATIONS

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

(56) References Cited

OTHER PUBLICATIONS

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Kenji Nomura et al.; "Room-temperature fabrication of transparent flexible thin-film transistors using amorphous oxide semiconductors"; Nature; Nov. 25, 2004; pp. 488-492; vol. 432.

Kenji Nomura et al.; "Thin-Film Transistor Fabricated in Single-Crystalline Transparent Oxide Semiconductor"; Science; May 23, 2003; pp. 1269-1272; vol. 300, No. 5623.

Kinam Kim; "Technology for sub-50nm DRAM and NAND Flash Manufacturing"; IEDM 05: Technical Digest of International Electron Devices Meeting; Dec. 5, 2005; pp. 333-336.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn—Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, Ret al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

(56) References Cited

OTHER PUBLICATIONS

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka, N. et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4-ZnO system at 1350° C.," Journal of Solid State Chemistry, Aug. 1, 1991, vol 93, No. 2, pp. 298-315.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

\* cited by examiner

FIG. 1A1
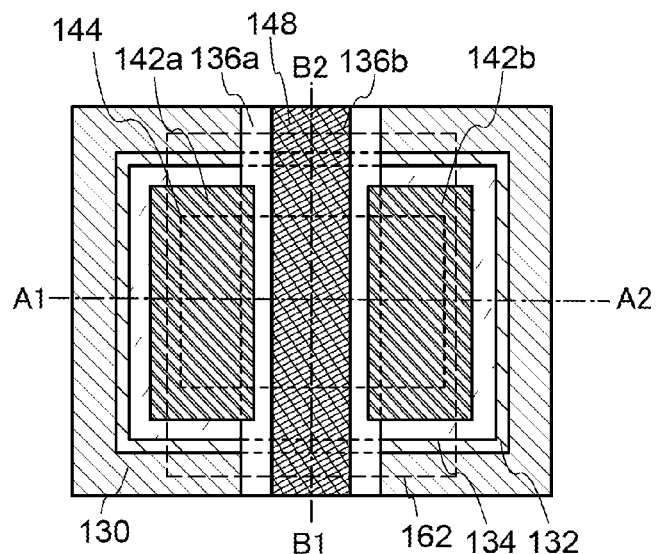
FIG. 1A2
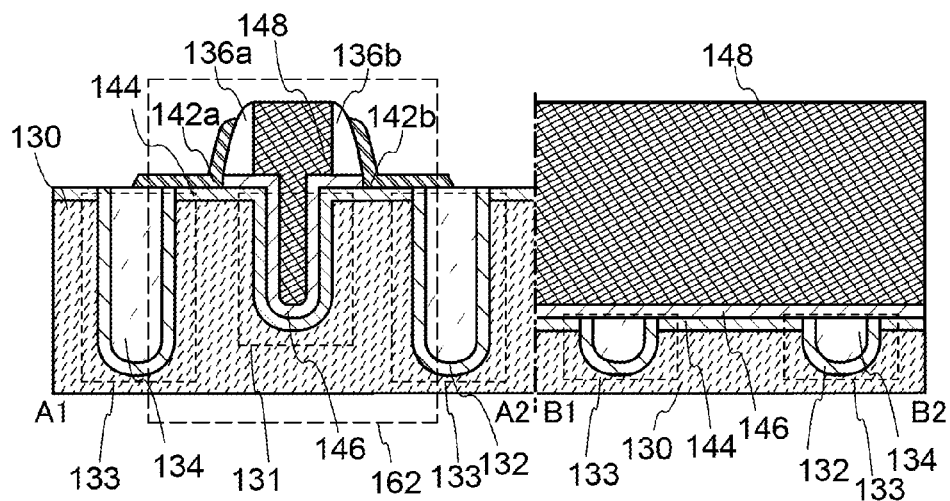

FIG. 2A1
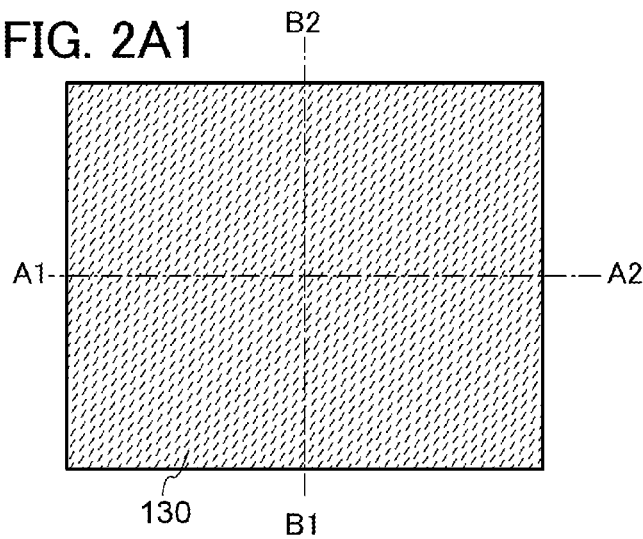
FIG. 2A2
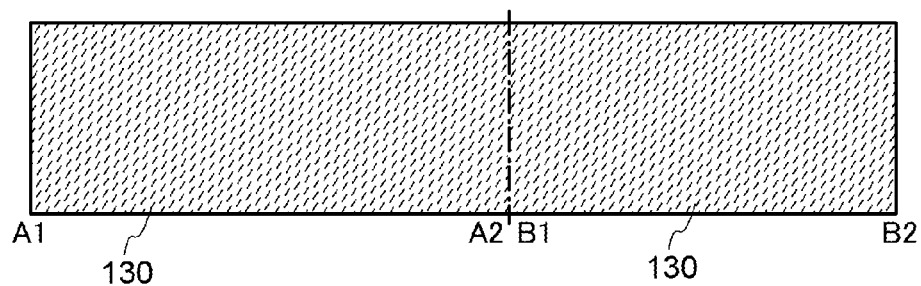
FIG. 2B1
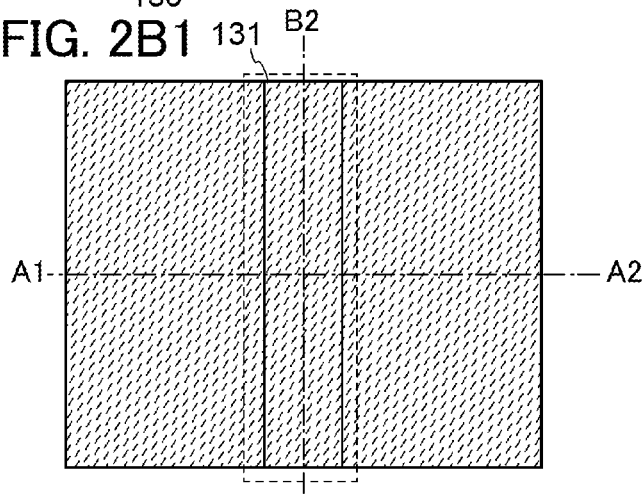
FIG. 2B2
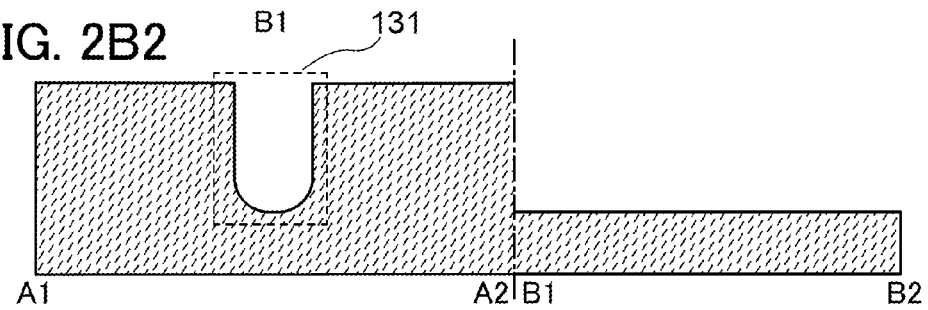

FIG. 3A1
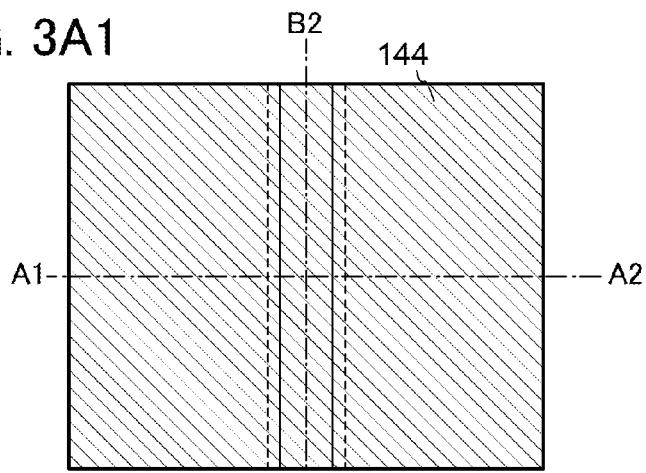
FIG. 3A2
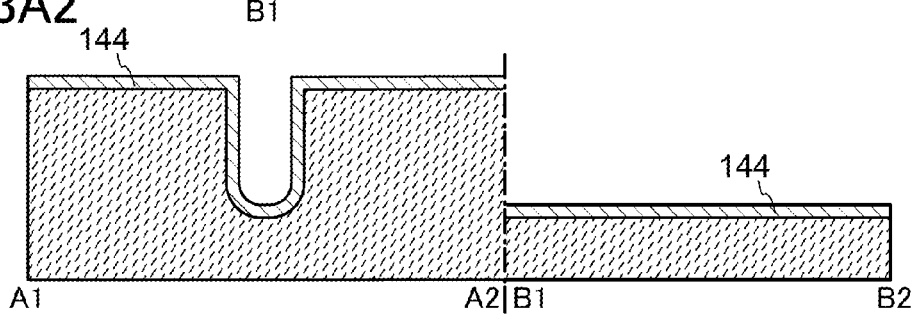
FIG. 3B1
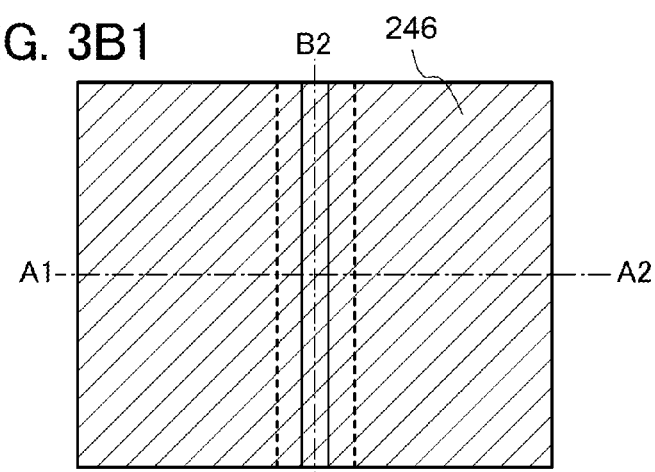
FIG. 3B2
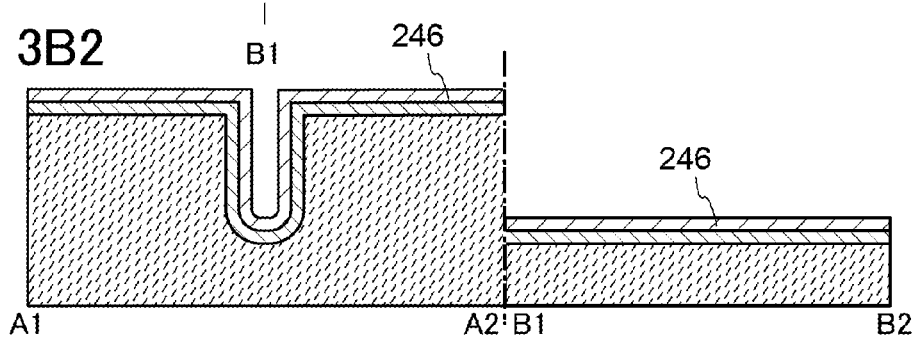

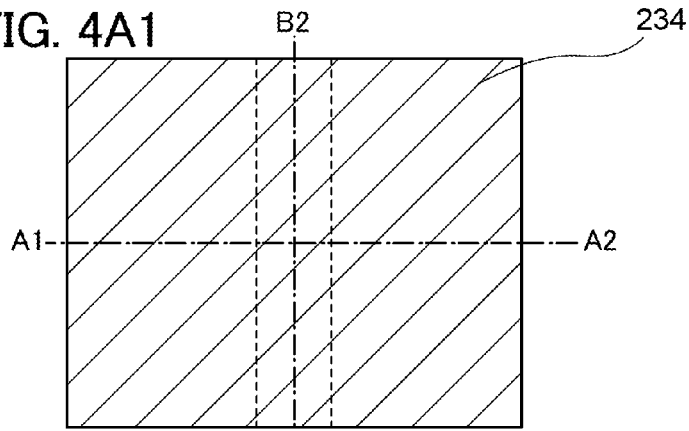
FIG. 4A1
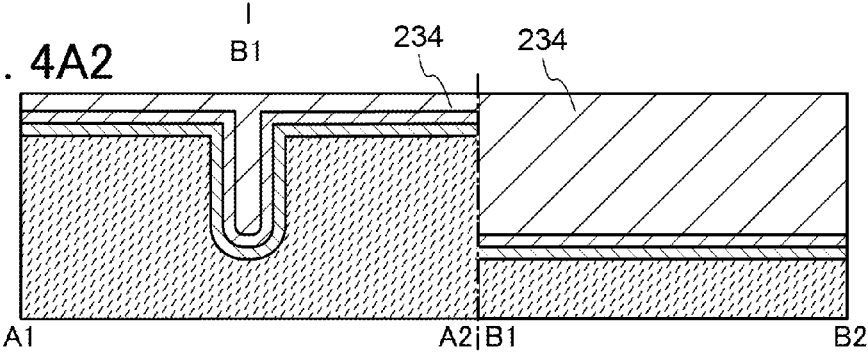
FIG. 4A2
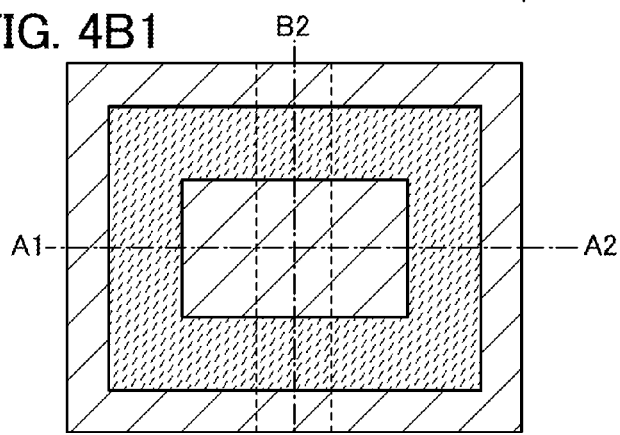
FIG. 4B1
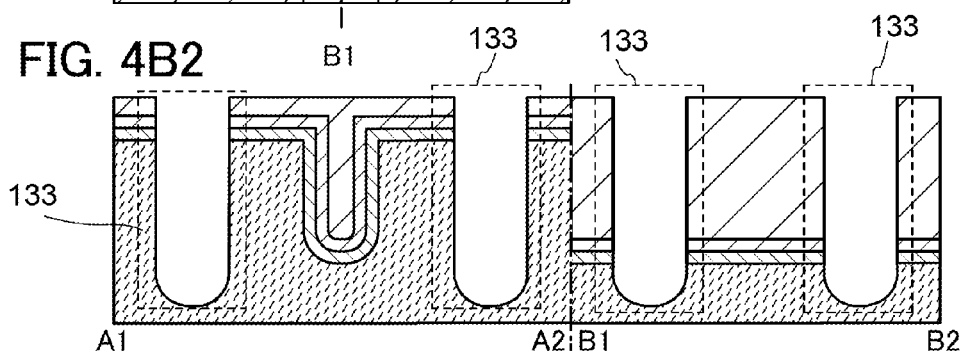
FIG. 4B2

FIG. 5A1
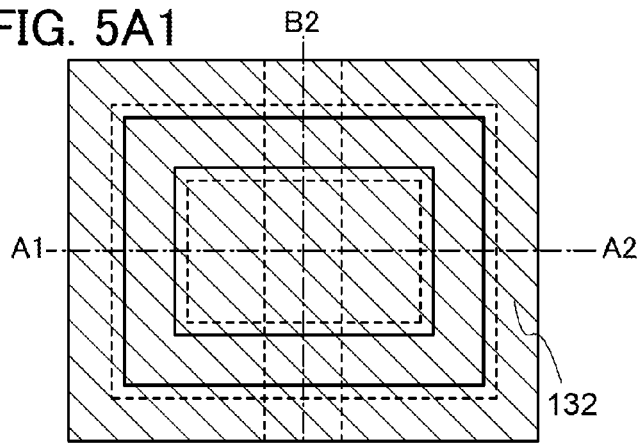
FIG. 5A2
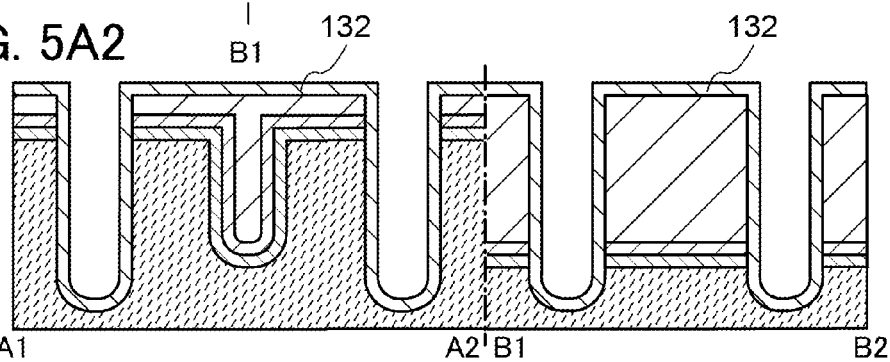
FIG. 5B1
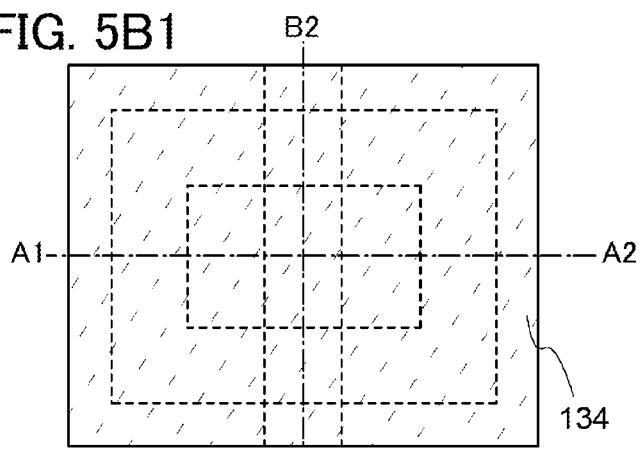
FIG. 5B2
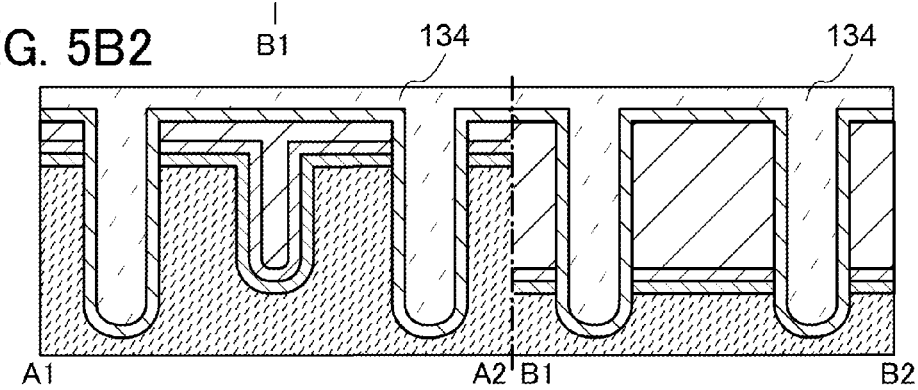

FIG. 6A1
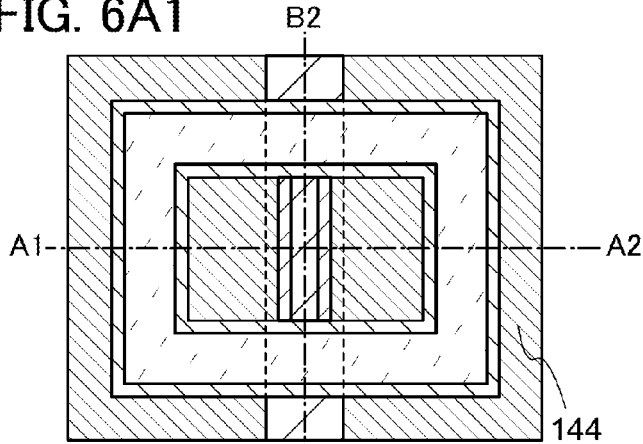
FIG. 6A2
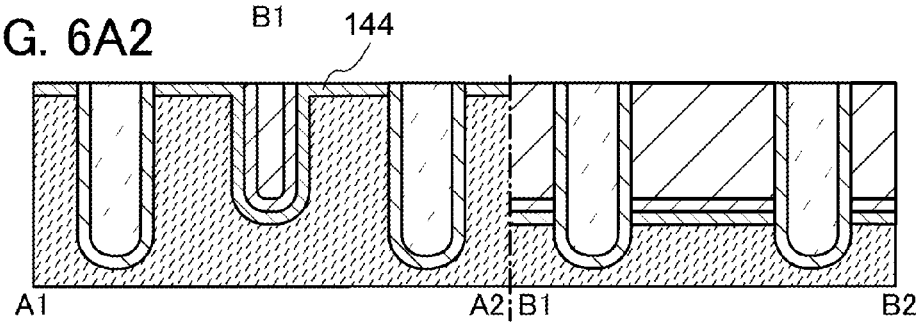
FIG. 6B1
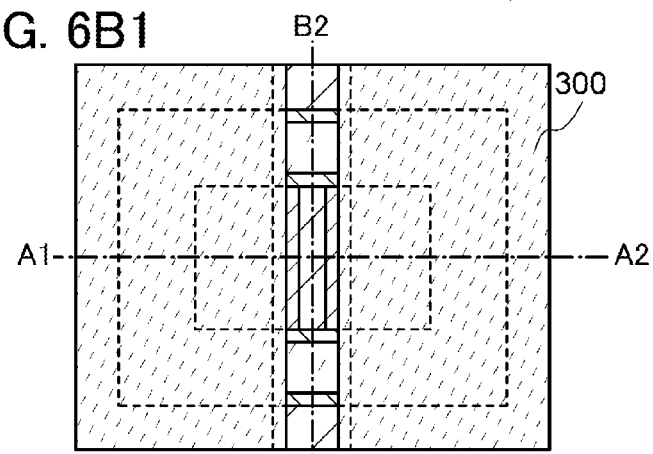
FIG. 6B2
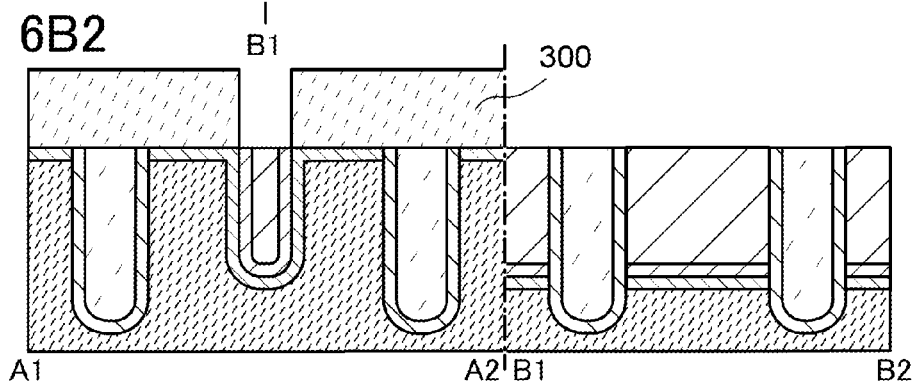

FIG. 7A1
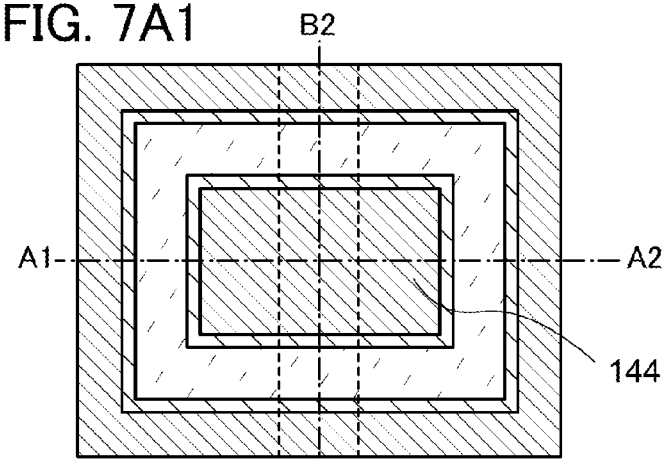
FIG. 7A2
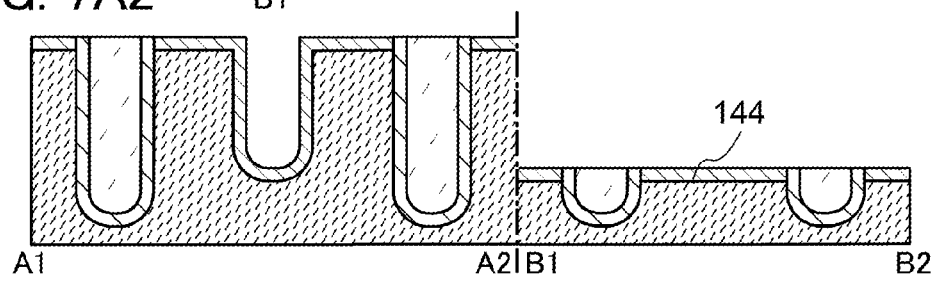
FIG. 7B1
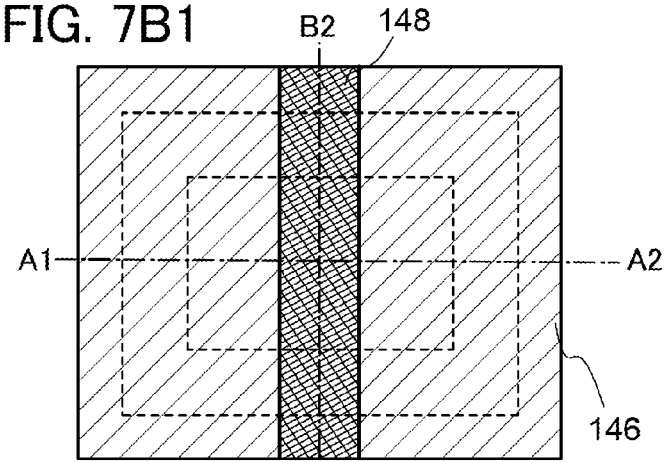
FIG. 7B2
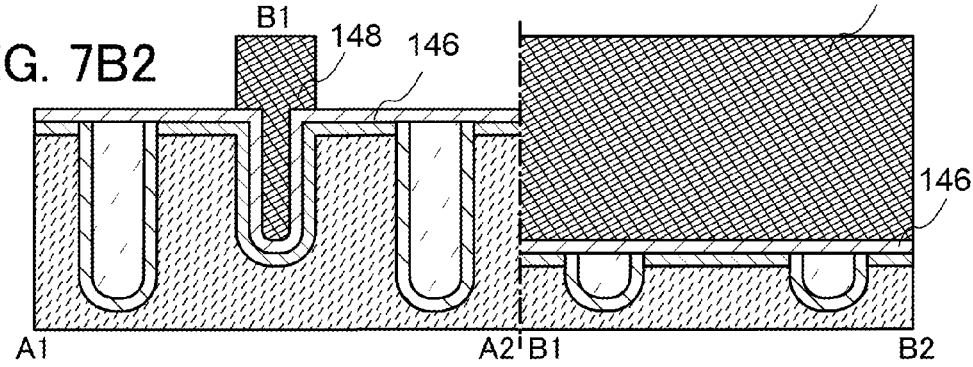

FIG. 8A1
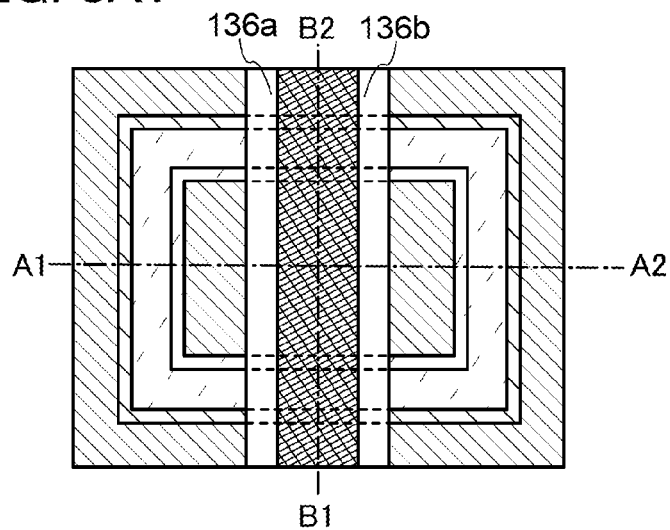
FIG. 8A2
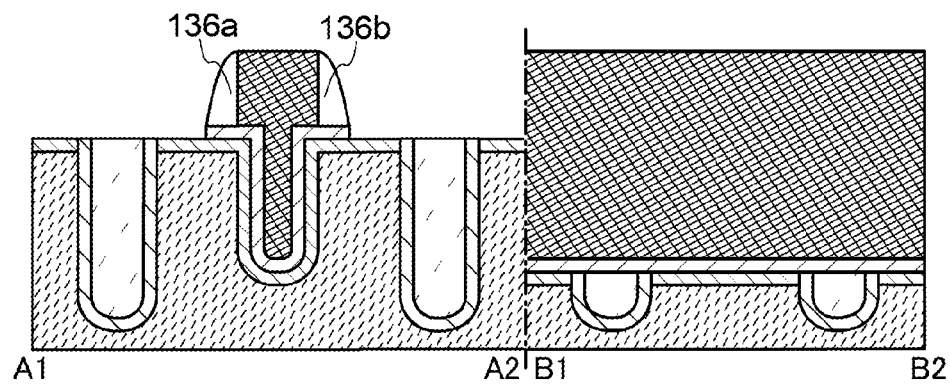

OXIDE SEMICONDUCTOR DEVICE INCLUDING GATE TRENCH AND ISOLATION TRENCH

BACKGROUND OF THE INVENTION

1. Field of the Invention

The invention disclosed in this specification relates to a semiconductor device using a semiconductor element.

2. Description of the Related Art

Storage devices using semiconductor elements are broadly classified into two categories: a volatile device that loses stored data when power supply stops, and a non-volatile device that retains stored data even when power is not supplied.

A typical example of a volatile storage device is a DRAM (dynamic random access memory). A memory cell which is a key component in a DRAM includes a read and write transistor and a capacitor.

Circuit patterns for DRAMs, like those for other semiconductor integrated circuits, have been increasingly miniaturized in accordance with the scaling law. However, in a transistor having a channel length of 100 nm or less, a punch-through current is likely to flow due to a short-channel effect and the transistor becomes incapable of functioning as a switching element, which has been considered to be a problem. In order to prevent a punch-through current, a method in which a silicon substrate is doped with an impurity at high concentration is given. This method makes a junction leakage current likely to flow between a source and the substrate or between a drain and the substrate and eventually causes deterioration of memory retention characteristics. Therefore, the method is not an appropriate solution to the problem.

Against such a problem, a method has been considered for reducing the area occupied by one memory cell and also maintaining an effective channel length so as not to cause a short-channel effect by forming a three-dimensional transistor in the memory cell. Disclosed is one example of a structure in which a U-shaped vertically long groove is formed in a region where a channel portion of a transistor is formed, a gate insulating film is formed along a wall surface in the groove, and a gate electrode is formed so as to fill the groove (see Non-Patent Document 1).

A transistor having a channel portion of such a structure has a long effective channel length because a current flows between a source region and a drain region via an indirect route across the groove portion. This provides an advantageous effect of reducing the area occupied by a transistor in a memory cell and suppressing a short-channel effect.

However, a conventional DRAM needs to be refreshed at an interval of several tens of milliseconds to hold data, which results in large power consumption. In addition, a transistor therein is frequently turned on and off; thus, deterioration of the transistor is also a problem. These problems become significant as the memory capacity increases and transistor miniaturization advances.

Further, a typical example of a non-volatile memory device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for holding of charge in the floating gate or removal of the charge, and a circuit for generating high voltage is also necessary. Further, it takes a relatively long time to hold or remove charge, so that it is not easy to increase the speed of write and erase operations.

REFERENCES

[Patent Document 1] Japanese Published Patent Application No. S57-105889

[Non-Patent Document] Kinam Kim, "Technology for sub-50 nm DRAM and NAND Flash Manufacturing", International Electron Devices Meeting, 2005. IEDM Technical Digest, December 2005, pp. 333-336

SUMMARY OF THE INVENTION

Therefore, it is an object of one embodiment of the present invention to provide a semiconductor device in which improvement of a property of holding stored data can be achieved. Further, it is an object of one embodiment of the present invention to reduce the power consumption of a semiconductor device. Furthermore, it is an object of one embodiment of the present invention to provide a semiconductor device having a novel structure, which does not have a limitation on the number of write cycles.

In the disclosed invention, a semiconductor device is formed using a wide-gap semiconductor material capable of sufficiently reducing the off-state current of a transistor (for example, an oxide semiconductor material). The use of a semiconductor material capable of sufficiently reducing the off-state current of a transistor enables data to be held for a long time.

In accordance with one embodiment of the present invention, a semiconductor device includes a first insulating layer in which a first trench and a second trench are provided, an oxide semiconductor layer provided in contact with a bottom surface and an inner wall surface of the first trench, a second insulating layer provided in contact with a bottom surface and an inner wall surface of the second trench, a third insulating layer which is provided in contact with the second insulating layer and which fills the second trench, a gate insulating layer provided over the oxide semiconductor layer, a gate electrode which is provided over the gate insulating layer and which fills the first trench, a sidewall insulating layer provided in contact with the gate electrode, and a source electrode and a drain electrode which are provided in contact with the sidewall insulating layer and the oxide semiconductor layer.

Further, in accordance with one embodiment of the present invention, a semiconductor device includes a plurality of memory cells each including a transistor and a capacitor. In the semiconductor device, the transistor includes a first insulating layer in which a first trench and a second trench are provided, an oxide semiconductor layer provided in contact with a bottom surface and an inner wall surface of the first trench, a second insulating layer provided in contact with a bottom surface and an inner wall surface of the second trench, a third insulating layer which is provided in contact with the second insulating layer and which fills the second trench, a gate insulating layer provided over the oxide semiconductor layer, a gate electrode which is provided over the gate insulating layer and which fills the first trench, a sidewall insulating layer provided in contact with the gate electrode, and a source electrode and a drain electrode which are provided in contact with the sidewall insulating layer and the oxide semiconductor layer. In the semiconductor device, one of the source electrode and the drain electrode is electrically connected to one electrode of the capacitor.

In any one of the above semiconductor devices, it is preferable that each of the source electrode and the drain electrode be provided so as to overlap with at least part of the third insulating layer.

Further, in accordance with one embodiment of the present invention, a semiconductor device includes a plurality of memory cells each including a first transistor, a second transistor, and a capacitor. In the semiconductor device, the first transistor includes a first channel formation region, a first gate insulating layer provided over the first channel formation region, and a first gate electrode which overlaps with the first channel formation region and which is provided over the first gate insulating layer and the second transistor includes a first insulating layer in which a first trench and a second trench are provided, an oxide semiconductor layer which is provided in contact with a bottom surface and an inner wall surface of the first trench and which includes at least a second channel formation region, a second insulating layer provided in contact with a bottom surface and an inner wall surface of the second trench, a third insulating layer which is provided in contact with the second insulating layer and which fills the second trench, a second gate insulating layer provided over the oxide semiconductor layer, a second gate electrode which is provided over the second gate insulating layer and which fills the first trench, a sidewall insulating layer provided in contact with the second gate electrode, and a second source electrode and a second drain electrode which are provided in contact with the sidewall insulating layer and the oxide semiconductor layer. In the semiconductor device, the second channel formation region has a wider energy gap than the first channel formation region, and the first gate electrode, the second source electrode, and one electrode of the capacitor are electrically connected. In the semiconductor device, the first transistor is provided so as to overlap with at least part of the second transistor.

Further, in the above semiconductor devices, it is preferable that each of the second source electrode and the second drain electrode be provided so as to overlap with at least part of the third insulating layer.

Furthermore, in any one of the above semiconductor devices, it is preferable that a stack of a silicon oxide film and an aluminum oxide film is provided as the second insulating layer, and the silicon oxide film be in contact with the oxide semiconductor layer.

Note that the term such as "over" in this specification and the like does not necessarily mean that a component is placed "directly on" another component. For example, the expression "a gate electrode over a gate insulating layer" can mean the case where there is an additional component between the gate insulating layer and the gate electrode. The same applies to the term "below".

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Since the off-state current of a transistor including a wide-gap semiconductor (for example, an oxide semiconductor) is extremely small, stored data can be held for an extremely long period by using the transistor for a semiconductor memory device. In other words, power consumption can be adequately reduced because refresh operation of a semiconductor memory device becomes unnecessary or the frequency of refresh operation can be extremely low.

In the transistor having a trench structure disclosed in this specification, the occurrence of a short-channel effect can be suppressed by appropriately setting the depth of the first trench even when the distance between the source electrode and the drain electrode is decreased.

BRIEF DESCRIPTION OF THE DRAWINGS

FIGS. 1A1 and 1A2 are a plan view and a cross-sectional view illustrating a semiconductor device of one embodiment of the present invention.

FIGS. 2A1, 2A2, 2B1, and 2B2 are plan views and cross-sectional views illustrating a manufacturing process of a semiconductor device of one embodiment of the present invention.

FIGS. 3A1, 3A2, 3B1, and 3B2 are plan views and cross-sectional views illustrating a manufacturing process of a semiconductor device of one embodiment of the present invention.

FIGS. 4A1, 4A2, 4B1, and 4B2 are plan views and cross-sectional views illustrating a manufacturing process of a semiconductor device of one embodiment of the present invention.

FIGS. 5A1, 5A2, 5B1, and 5B2 are plan views and cross-sectional views illustrating a manufacturing process of a semiconductor device of one embodiment of the present invention.

FIGS. 6A1, 6A2, 6B1, and 6B2 are plan views and cross-sectional views illustrating a manufacturing process of a semiconductor device of one embodiment of the present invention.

FIGS. 7A1, 7A2, 7B1, and 7B2 are plan views and cross-sectional views illustrating a manufacturing process of a semiconductor device of one embodiment of the present invention.

FIGS. 8A1 and 8A2 are a plan view and a cross-sectional view illustrating a manufacturing process of a semiconductor device of one embodiment of the present invention.

DETAILED DESCRIPTION OF THE INVENTION

Figure 9A:
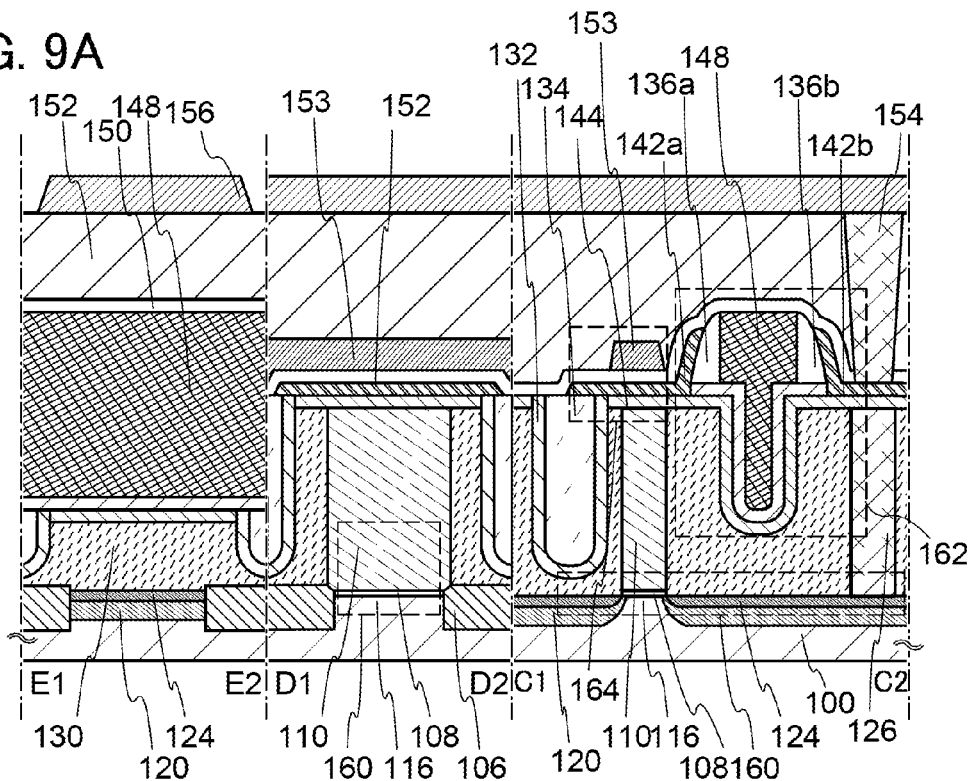
FIGS. 9A, 9B, and 9C are cross-sectional views, a plan view, and a circuit diagram illustrating a semiconductor device of one embodiment of the present invention.

Examples of embodiments of the present invention will be described below with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a semiconductor device that is one embodiment of the present invention and a manufacturing method thereof are described with reference to FIGS. 1A1 and 1A2; FIGS. 2A1, 2A2, 2B1, and 2B2; FIGS. 3A1, 3A2, 3B1, and 3B2; FIGS. 4A1, 4A2, 4B1, and 4B2; FIGS. 5A1, 5A2, 5B1, and 5B2; FIGS. 6A1, 6A2, 6B1, and 6B2; FIGS. 7A1, 7A2, 7B1, and 7B2; and FIGS. 8A1 and 8A2.

FIG. 1A1 illustrates an example of a plan view of a transistor 162 in this embodiment. Further, FIG. 1A2 illustrates cross-sections taken along the chain line A1-A2 and the chain line B1-B2 in FIG. 1A1.

The transistor 162 described in this embodiment includes an insulating layer 130 in which a first trench 131 and a second trench 133 are provided, an oxide semiconductor layer 144 provided in contact with a bottom surface and an inner wall surface of the first trench 131, an insulating layer 132 provided in contact with a bottom surface and an inner wall surface of the second trench 133, an insulating layer 134 which is provided in contact with the insulating layer 132 and which fills the second trench 133, a gate insulating layer 146 provided over the oxide semiconductor layer 144, a gate electrode 148 which is provided over the gate insulating layer 146 and which fills the first trench 131, sidewall insulating layers 136a and 136b provided in contact with the gate electrode 148, a source electrode (or a drain electrode) 142a provided in contact with the sidewall insulating layer 136a and the oxide semiconductor layer 144, and a drain electrode (or a source electrode) 142b provided in contact with the sidewall insulating layer 136b and the oxide semiconductor layer 144.

In the transistor 162 illustrated in FIGS. 1A1 and 1A2, the oxide semiconductor layer 144 is provided in contact with the bottom surface and the inner wall surface of the first trench 131. The cross-sectional shape of the oxide semiconductor layer 144 in the channel-length direction (the direction of carrier flow) is a shape curved along the cross-sectional shape of the first trench 131, that is, a U shape. With this structure, as the first trench 131 becomes deeper, an effective channel length of the transistor 162 can be increased.

Therefore, the occurrence of a short-channel effect can be suppressed while miniaturization of the transistor is accomplished by appropriately setting the depth of the first trench 131 and keeping the effective channel length even when the distance between the source electrode 142a and the drain electrode 142b is decreased. Note that it is preferable that an upper surface shape of the first trench 131 be a stripe shape which extends in the channel-width direction of the transistor 162 (the direction perpendicular to the direction of carrier flow).

In this embodiment, an example in which the oxide semiconductor layer 144 is used as a wide-gap semiconductor layer is described. As the oxide semiconductor, an oxide semiconductor having an energy gap larger than at least 1.1 eV, which is the energy gap of silicon, can be applied; for example, an In—Ga—Zn—O-based oxide semiconductor having an energy gap of 3.15 eV, indium oxide having an energy gap of about 3.0 eV, indium tin oxide having an energy gap of about 3.0 eV, indium gallium oxide having an energy gap of about 3.3 eV, indium zinc oxide having an energy gap of about 2.7 eV, tin oxide having an energy gap of about 3.3 eV, zinc oxide having an energy gap of about 3.37 eV, or the like can be preferably used. Note that the wide-gap semiconductor which can be applied to the semiconductor device of one embodiment of the present invention is not limited to the above oxide semiconductors. Alternatively, gallium nitride, gallium oxynitride, gallium zinc oxynitride, and the like may be used. With the use of such a material, the off-state current of the transistor 162 can be kept extremely low.

Here, the oxide semiconductor layer 144 used for the transistor 162 is preferably a purified oxide semiconductor layer by sufficiently removing impurities such as hydrogen or sufficiently supplying oxygen. Specifically, the hydrogen concentration of the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration of the oxide semiconductor layer 144 is measured by secondary ion mass spectrometry (SIMS).

Thus, in the oxide semiconductor layer 144 in which the hydrogen concentration is sufficiently reduced and defect states in the energy gap due to oxygen deficiency are reduced by sufficient supply of oxygen so that the oxide semiconductor layer is highly purified, the carrier concentration is lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per micrometer (μm) of channel width) at room temperature (25° C.) is lower than or equal to 100 zA (1 zA (zeptoampere) is $1 \times 10^{-21}$ A), preferably lower than or equal to 10 zA. In this manner, by using an oxide semiconductor which is made to be an i-type (intrinsic) oxide semiconductor or a substantially i-type oxide semiconductor, the transistor 162 which has extremely favorable off-state current characteristics can be obtained.

An example of a manufacturing process of the transistor 162 illustrated in FIGS. 1A1 and 1A2 will be described below with reference to FIGS. 2A1, 2A2, 2B1, and 2B2; FIGS. 3A1, 3A2, 3B1, and 3B2; FIGS. 4A1, 4A2, 4B1, and 4B2; FIGS. 5A1, 5A2, 5B1, and 5B2; FIGS. 6A1, 6A2, 6B1, and 6B2; FIGS. 7A1, 7A2, 7B1, and 7B2; and FIGS. 8A1 and 8A2. Note that in each of these drawings, A1 is a plan view of the transistor 162 in the manufacturing process thereof and A2 illustrates cross-sections taken along the chain line A1-A2 and the chain line B1-B2 in A1. Similarly, B1 is a plan view of the transistor 162 in the manufacturing process thereof and B2 illustrates cross-sections taken along the chain line A1-A2 and the chain line B1-B2 in B1.

First, the insulating layer 130 is formed over a substrate (not illustrated in the drawings) containing a semiconductor material (see FIGS. 2A1 and 2A2).

For the substrate containing a semiconductor material, a single crystal semiconductor substrate of silicon, carbon silicon, or the like; a microcrystalline semiconductor substrate; a compound semiconductor substrate of silicon germanium or the like; an SOI substrate; or the like can be used. A semiconductor element may be formed using the substrate. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

The insulating layer 130 can be formed using a silicon oxide film, a gallium oxide film, an aluminum oxide film, a silicon nitride film, a silicon oxynitride film, an aluminum oxynitride film, a silicon nitride oxide film, or the like.

Next, the first trench 131 (also referred to as a groove) is formed in the insulating layer 130 (see FIGS. 2B1 and 2B2). The trench may be formed using a known technique; for example, the trench can be formed in a single etching step or through a plurality of etching steps.

Then, the oxide semiconductor layer 144 is formed so as so be in contact with the bottom surface and the inner wall surface of the first trench 131 formed in the insulating layer 130 (see FIGS. 3A1 and 3A2). The oxide semiconductor layer 144 can have a thickness of 1 nm to 100 nm and can be formed by a sputtering method, a molecular beam epitaxy (MBE) method, a pulse laser deposition method, an atomic layer deposition (ALD) method, or the like as appropriate. The oxide semiconductor layer 144 may be formed using a sputtering apparatus which performs film formation with surfaces of a plurality of substrates set substantially perpendicular to a surface of a sputtering target.

As a material of the oxide semiconductor layer 144, an oxide semiconductor having a larger energy gap than at least silicon is used. As an oxide semiconductor having a larger energy gap than silicon, for example, an oxide of four metal elements, such as an In—Sn—Ga—Zn—O-based oxide semiconductor; an oxide of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; an oxide of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based material; or an oxide of one metal element, such as an In—O-based oxide semiconductor, a Sn—O-based oxide semiconductor, or a Zn—O-based oxide semiconductor can be used. In this embodiment, an In—Ga—Zn—O-based oxide semiconductor is used.

Note that for example, an In—Ga—Zn—O-based oxide semiconductor means an oxide semiconductor containing indium (In), gallium (Ga), and zinc (Zn), and there is no limitation on the composition ratio thereof.

As the oxide semiconductor layer 144, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The deposition atmosphere may be a rare gas (typically argon) atmosphere, an oxygen atmosphere, a mixed atmosphere containing a rare gas and oxygen, or the like. An atmosphere of a high-purity gas from which impurities such as hydrogen, water, a hydroxyl group, or hydride are sufficiently removed is preferable, in order to prevent hydrogen, water, a hydroxyl group, hydride, or the like from entering the oxide semiconductor layer 144.

The substrate may be heated so that the substrate temperature reaches a temperature higher than or equal to 200° C. and lower than or equal to 500° C., preferably higher than or equal to 300° C. and lower than or equal to 500° C., further preferably higher than or equal to 350° C. and lower than or equal to 450° C.

After the formation of the oxide semiconductor layer 144, heat treatment (first heat treatment) may be performed on the oxide semiconductor layer 144. The heat treatment can further remove substances including hydrogen atoms in the oxide semiconductor layer 144. The heat treatment is performed under an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is higher than or equal to 6 N (99.9999%), preferably higher than or equal to 7 N (99.99999%) (that is, the concentration of the impurities is lower than or equal to 1 ppm, preferably lower than or equal to 0.1 ppm).

Note that the heat treatment can be referred to as dehydration treatment, dehydrogenation treatment, or the like because of its advantageous effect of removing hydrogen, water, or the like. The heat treatment can be performed at the timing, for example, after the oxide semiconductor layer is processed to have an island shape or after the gate insulating film is formed. Such dehydration treatment or dehydrogenation treatment may be conducted once or plural times.

Next, an insulating layer 246 is formed in the bottom surface and the inner wall surface of the first trench 131 or the like so as to be in contact with the oxide semiconductor layer 144 (see FIGS. 3B1 and 3B2).

The insulating layer 246 can have a thickness of 1 nm to 100 nm and can be formed by a sputtering method, an MBE method, a CVD method, a pulse laser deposition method, an ALD method, a coating method, a printing method, or the like as appropriate. The insulating layer 246 may be formed using a sputtering apparatus which performs film formation with surfaces of a plurality of substrates set substantially perpendicular to a surface of a sputtering target.

The insulating layer 246 can be formed using a silicon oxide film, a gallium oxide film, an aluminum oxide film, a silicon nitride film, a silicon oxynitride film, an aluminum oxynitride film, a silicon nitride oxide film, or the like.

Then, an insulating layer 234 is formed over the insulating layer 246 so as to fill the first trench 131. There is no particular limitation on the method for forming the insulating layer 246; it is preferable to use a CVD method such as a plasma CVD method so that the first trench 131 that is a minute gap is efficiently filled.

As a material of the insulating layer 234, a material similar to that of the insulating layer 246 can be used. Note that the insulating layer 246 is formed before the formation of the insulating layer 234, whereby a region filled with the insulating layer 234 can be decreased and the first trench 131 can be smoothly filled with the insulating layer 234. After the formation of the insulating layer 234, the insulating layer 234 is subjected to chemical mechanical polishing (CMP) treatment or etching treatment, so that the insulating layer 234 is planarized (see FIGS. 4A1 and 4A2).

Next, the second trench 133 for element isolation is formed (see FIGS. 4B1 and 4B2). The second trench 133 includes trenches for element isolation in the channel-length direction (the direction of carrier flow) and trenches for element isolation in the channel-width direction. Note that an upper surface shape of the second trench may be a grid shape in which the trenches for element isolation in the channel-length direction and the trenches for element isolation in the channel-width direction are connected to each other or a stripe shape in which the trenches are separately provided.

In this embodiment, the second trench 133 having a grid upper surface shape is formed. By the formation of the second trench 133, an upper surface shape of the oxide semiconductor layer 144 is processed to have an island shape. Note that the timing of the formation of the second trench 133 is not particularly limited. In addition, the depth of the second trench 133 is not limited to a depth at which the bottom thereof is at the same horizontal position as the bottom of the first trench 131, as long as sufficient element isolation can be achieved. It is preferable that the horizontal position of the bottom of the second trench 133 be deeper than that of the bottom of the first trench 131 because element isolation can be ensured.

Next, the insulating layer 132 is formed in contact with the bottom surface and the inner wall surface of the second trench 133 (see FIGS. 5A1 and 5A2). The insulating layer 132 is an inorganic insulating film containing oxygen and can be formed using an inorganic insulating material such as silicon oxide, silicon oxynitride, silicon nitride oxide, aluminum oxide, gallium oxide, or aluminum gallium oxide.

Note that it is preferable that the insulating layer 132 preferably contains oxygen sufficiently because the insulating layer 132 is in contact with side surfaces of the oxide semiconductor layer 144 on the inner wall surface of the second trench 133. Further, the insulating layer 132 preferably contains a large amount of oxygen which exceeds at least the stoichiometric composition ratio in (a bulk of) the layer. For example, in the case where a silicon oxide film is used as the insulating layer 132, it is preferable that the composition ratio of the silicon oxide film be $SiO_{2+\alpha}$ ($\alpha>0$).

The insulating layer 132 contains oxygen sufficiently, whereby even when the oxide semiconductor layer 144 includes oxygen deficiency, oxygen can be supplied to the oxide semiconductor layer 144 and oxygen deficiency in the oxide semiconductor layer 144 can be filled. Accordingly, a variation in threshold voltage or shift in the threshold voltage, which is due to oxygen deficiency in the oxide semiconductor layer 144, can be reduced, so that characteristics of the transistor 162 can be improved.

There is no particular limitation on the method for forming the insulating layer 132; in consideration of contact with the oxide semiconductor layer 144, it is preferable that impurities such as hydrogen be sufficiently removed. Therefore, it is preferable that the insulating layer 132 be formed by a sputtering method by which impurities such as hydrogen are less likely to enter the insulating layer 132. Note that the insulating layer 132 may have a single-layer structure or a stacked-layer structure. For example, the insulating layer 132 can have a stacked-layer structure in which a silicon oxide film and an aluminum oxide film are sequentially stacked on the side in contact with the oxide semiconductor layer 144. Note that an aluminum oxide film has a property of not easily transmitting water. Thus, it is preferable to use the film in terms of preventing entry of water to the oxide semiconductor layer 144.

Then, an insulating layer 134 is formed over the insulating layer 132 so as to fill the second trench 133. There is no particular limitation on the method for forming the insulating layer 134; it is preferable to use a CVD method such as a plasma CVD method so that the second trench 133 that is a minute gap is efficiently filled.

As a material of the insulating layer 134, a material similar to that of the insulating layer 246 can be used. Note that the insulating layer 132 is formed before the formation of the insulating layer 134, whereby a region filled with the insulating layer 134 can be decreased and the second trench 133 can be smoothly filled with the insulating layer 134. After the formation of the insulating layer 134, the insulating layer 134 is subjected to chemical mechanical polishing (CMP) treatment or etching treatment, so that the insulating layer 134 is flattened (see FIGS. 5B1 and 5B2).

Note that in the case where the insulating layer 132 is formed using a sputtering method by which impurities such as hydrogen can be reduced and the insulating layer 134 is formed using a plasma CVD method by which excellent coverage can be obtained, in the transistor 162, the hydrogen concentration in the insulating layer 132 is lower than that in the insulating layer 134. Further, for example, in the case where the material and the film formation method of the insulating layer 132 are the same as those of the insulating layer 134, in the transistor 162, it may be extremely difficult to determine a boundary between the insulating layer 132 and the insulating layer 134.

After the formation of the insulating layer 134, second heat treatment is preferably performed in an inert gas atmosphere or an oxygen atmosphere. The heat treatment temperature is preferably higher than or equal to 200° C. and lower than or equal to 450° C., and more preferably higher than or equal to 250° C. and lower than or equal to 350° C. The second heat treatment can reduce variation in electric characteristics of the transistor. Further, in the case where the insulating layer in contact with the oxide semiconductor layer 144 contains oxygen, oxygen is supplied to the oxide semiconductor layer 144 to fill oxygen deficiency in the oxide semiconductor layer 144, so that an i-type (intrinsic semiconductor) or substantially i-type oxide semiconductor layer can be formed.

Note that the second heat treatment is performed after the formation of the insulating layer 134 in this embodiment; the timing of the second heat treatment is not limited thereto. For example, the second heat treatment may be performed after the formation of the insulating layer 132. The second heat treatment may be performed following the first heat treatment.

As described above, the first heat treatment and the second heat treatment are applied, whereby the oxide semiconductor layer 144 can be highly purified.

Next, the insulating layers 246, 234, 132 and 134 are subject to etch-back treatment or CMP treatment, whereby part of the oxide semiconductor layer 144 is exposed (see FIGS. 6A1 and 6A2). Alternatively, CMP treatment and etch-back treatment may be employed in combination. In the oxide semiconductor layer 144, by etch-back treatment or CMP treatment, the region provided in contact with the upper surface of the insulating layer 130 (the region other than the region provided in contact with the bottom surface and the inner wall surface of the first trench 131) is exposed.

After that, a resist mask 300 is formed over the oxide semiconductor layer 144 exposed through a photolithography process (see FIGS. 6B1 and 6B2). Note that the resist mask 300 may be formed by an inkjet method, in which case manufacturing costs can be reduced because a photomask is not used.

Next, the insulating layer 246 and the insulating layer 234 provided in the first trench 131 are selectively removed by etching with the use of the resist mask 300, whereby the oxide semiconductor layer 144 provided in contact with the bottom surface and the inner wall surface of the first trench 131 is exposed. After that, the resist mask 300 is removed (see FIGS. 7A1 and 7A2).

The insulating layers 246 and 234 may be etched by either dry etching or wet etching. Note that it is preferable to use dry etching because the insulating layers 246 and 234 can be etched by dry etching even when the width of the first trench 131 is formed in a minute pattern.

Next, the gate insulating layer 146 is formed over the oxide semiconductor layer 144 exposed and the gate electrode 148 is formed over the gate insulating layer 146 so as to fill the first trench 131 (see FIGS. 7B1 and 7B2).

The gate insulating layer 146 can have a thickness of 1 nm to 100 nm and can be formed by a sputtering method, an MBE method, a CVD method, a pulse laser deposition method, an ALD method, a coating method, a printing method, or the like as appropriate. Note that in consideration of contact with the oxide semiconductor layer 144, it is preferable that impurities such as hydrogen be sufficiently removed. Accordingly, it is preferable that the gate insulating layer 146 be formed by a sputtering method by which impurities such as hydrogen are less likely to enter the gate insulating layer 146.

The gate insulating layer 146 can be formed using a silicon oxide film, a gallium oxide film, an aluminum oxide film, a silicon nitride film, a silicon oxynitride film, an aluminum oxynitride film, a silicon nitride oxide film, or the like. Further, the gate insulating layer 146 is preferably formed in consideration of the size of a transistor to be formed and the step coverage with the gate insulating layer 146.

In this embodiment, a silicon oxide film of $SiO_{2+\alpha}$ ($\alpha>0$) is used as the gate insulating layer 146. By using the silicon oxide film as the gate insulating layer 146, oxygen can be supplied to the In—Ga—Zn—O-based oxide semiconductor and favorable characteristics can be obtained.

When the gate insulating layer 146 is formed using, for example, a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), or hafnium aluminate ($HfAl_xO_y$ (x>0, y>0)), while the substantial (e.g., silicon oxide equivalent) thickness of the gate insulating layer is not changed, the physical thickness of the gate insulating layer can be increased; therefore, gate leakage current can be reduced. Further, the gate insulating layer 146 may have a single-layer structure or a stacked-layer structure.

The gate electrode 148 can be formed using a metal material such as molybdenum, titanium, tantalum, tungsten, aluminum, copper, chromium, neodymium, or scandium or an alloy material which contains any of these materials as its main component. Note that the gate electrode 148 may have a single-layer structure or a stacked-layer structure.

As one layer of the gate electrode 148 which is in contact with the gate insulating layer 146, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film is preferably used. These films each have a work function of 5 eV or higher, preferably 5.5 eV or higher, which enables the threshold voltage which is one of the electrical characteristics of the transistor to be positive when used as the gate electrode. Accordingly, a so-called normally off switching element can be provided.

Next, an insulating layer is formed to cover the gate electrode 148 and then the insulating layer is processed to form sidewall insulating layers 136a and 136b. The insulating layer for forming the sidewall insulating layers 136a and 136b can be formed by a CVD method, a sputtering method, or the like. The insulating layer preferably contains silicon oxide, silicon nitride, silicon oxynitride, aluminum oxide, or the like. Note that the insulating layer may have a single-layer structure or a stacked-layer structure.

The sidewall insulating layers 136a and 136b can be formed in a self-aligned manner by performing highly anisotropic etching treatment on the insulating layer for forming the sidewall insulating layers 136a and 136b. Here, dry etching is preferable as highly anisotropic etching.

Next, the gate insulating layer 136 is selectively etched with the use of the sidewall insulating layers 136a and 136b as masks (see FIGS. 8A1 and 8A2). Through this etching step, part of the island-shaped oxide semiconductor layer 144 is exposed.

Note that before the formation of the insulating layer over the gate electrode 148, impurities may be introduced with the use of the gate electrode 148 as a mask to form impurity regions in the oxide semiconductor layer 144.

Next, a conductive layer in contact with the region where the oxide semiconductor layer 144 is exposed is formed over the sidewall insulating layers 136a and 136b and then the conductive layer is processed to form a source electrode 142a and a drain electrode 142b, whereby the transistor 162 in this embodiment which is illustrated in FIGS. 1A1 and 1A2 can be manufactured.

The source electrode 142a and the drain electrode 142b can be formed using a metal material such as molybdenum, titanium, tantalum, tungsten, aluminum, copper, chromium, neodymium, or scandium, or an alloy material which contains any of these materials as its main component.

Note that as illustrated in FIGS. 1A1 and 1A2, it is preferable that each of the source electrode 142a and the drain electrode 142b overlap with at least part of the insulating layer 134. With such a structure, the alignment margin at the time of forming a wiring connected electrically to the source electrode 142a or the drain electrode 142b over these electrodes can be increased.

In this manner, the transistor 162 in this embodiment can be manufactured. In the transistor 162 described in this embodiment, the oxide semiconductor layer 144 is provided in contact with the bottom surface and the inner wall surface of the first trench 131, whereby the effective channel length of the transistor 162 can be longer than the distance between the source electrode 142a and the drain electrode 142b (the apparent channel length of the transistor 162). Accordingly, a short-channel effect can be suppressed while miniaturization of the transistor is achieved.

Further, a wide-gap semiconductor having a wide energy gap is used in a channel formation region of the transistor 162, whereby the off-state current of the transistor 162 can be reduced. In this embodiment, the highly purified and intrinsic oxide semiconductor layer 144 is used in a channel formation region, whereby the off-state current of the transistor 162 can be further reduced. Such a transistor is applied to a semiconductor memory device, whereby a semiconductor device that can hold the stored content for an extremely long time can be provided.

Further, the transistor 162 includes the insulating layer 132 containing oxygen provided in contact with the bottom surface and the inner wall surface of the second trench 133 for element isolation. Since the insulating layer 132 is in contact with side surfaces of the oxide semiconductor layer 144 which is processed into an island shape, when the insulating layer 132 contains oxygen, release of oxygen from the oxide semiconductor layer 144 can be prevented. Further, even when the oxide semiconductor layer 144 includes oxygen deficiency, oxygen deficiency in the oxide semiconductor layer 144 can be filled. Accordingly, a variation in threshold voltage can also be controlled in the transistor 162 in this embodiment.

Further, since the transistor 162 includes the sidewall insulating layers 136a and 136b, the distance between the source electrode 142a or the drain electrode 142b and the gate electrode is determined in a self-aligned manner by the width of the sidewall insulating layer. Therefore, the transistor can be miniaturized as compared to the case where the source electrode and the drain electrode are formed with a space for accurate mask alignment.

Further, the transistor 162 includes the sidewall insulating layers 136a and 136b, whereby at the time of contact with a wiring electrode directly connected downward to the source electrode 142a or the drain electrode 142b, the distance between the position of the contact and the gate electrode is determined in a self-aligned manner by the width of the sidewall. Therefore, a layout area can be reduced as compared to the case where the contact is formed with a space for the accurate mask alignment.

The structures, methods, and the like described in this embodiment can be combined as appropriate with any of the structures, methods, and the like described in the other embodiments.

Embodiment 2

In this embodiment, an example of a semiconductor device which includes the transistor 162 described in Embodiment 1, which can hold stored data even when not powered, and which does not have a limitation on the number of write cycles, will be described with reference to the drawings.

Since the off-state current of the transistor 162 is small, stored data can be held for a long time owing to such a transistor. In other words, power consumption can be sufficiently reduced because a semiconductor device in which refresh operation is unnecessary or the frequency of refresh operation is extremely low can be provided.

Figure 9B:
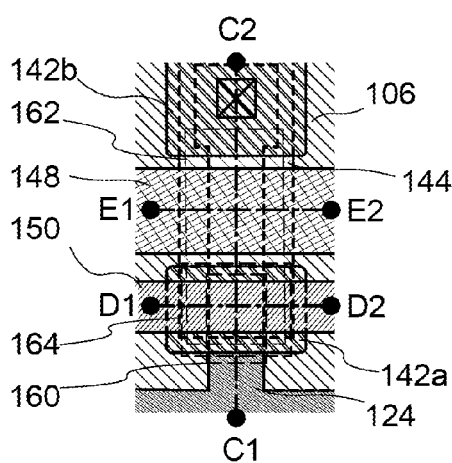
Figure 9C:
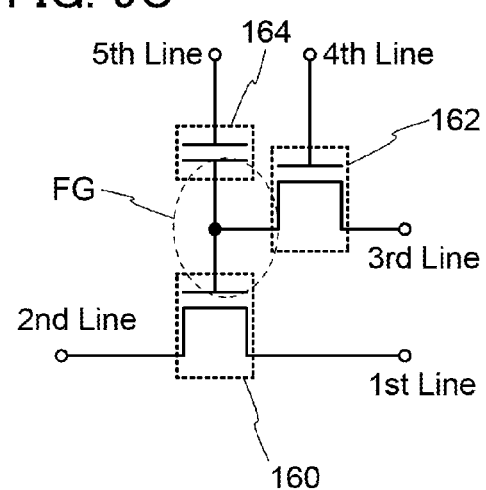

FIGS. 9A to 9C illustrate one example of a structure of the semiconductor device. FIGS. 9A to 9C illustrate a cross-sectional view, a plan view, and a circuit diagram, respectively, of the semiconductor device. Here, FIG. 9A corresponds to cross sections taken along the chain line C1-C2, the chain line D1-D2, and the chain line E1-E2 of FIG. 9B.

The semiconductor device illustrated in FIGS. 9A and 9B includes a transistor 160 including a first semiconductor material in a lower portion, and a transistor 162 including a second semiconductor material in an upper portion. Note that the structure of the transistor 162 is the same as that described in Embodiment 1; thus, for description of FIGS. 9A and 9B, the same reference numerals are used for the same parts as those in FIGS. 1A1 and 1A2.

Here, the first semiconductor material and the second semiconductor material are preferably materials having different energy gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor can hold charge for a long time owing to its characteristics.

Although all the transistors are n-channel transistors here, it is needless to say that p-channel transistors can be used. The technical nature of the disclosed invention is to use a wide-gap semiconductor in the transistor 162 so that data can be held. Therefore, it is not necessary to limit a specific structure of the semiconductor device, such as a material of the semiconductor device or a structure of the semiconductor device, to the structure described here.

The transistor 160 in FIG. 9A includes a channel formation region 116 provided in a substrate 100 including a semiconductor material (e.g., silicon), impurity regions 120 provided such that the channel formation region 116 is sandwiched therebetween, metal compound regions 124 in contact with the impurity regions 120, a gate insulating layer 108 provided over the channel formation region 116, and a gate electrode 110 provided over the gate insulating layer 108.

An electrode 126 is connected to part of the metal compound region 124 of the transistor 160. Here, the electrode 126 functions as a source electrode or a drain electrode of the transistor 160. Further, an element isolation insulating layer 106 is formed over the substrate 100 so as to surround the transistor 160, and an insulating layer 130 is formed to cover the transistor 160. Note that in order to realize higher integration, the transistor 160 preferably has a structure without a sidewall insulating layer as illustrated in FIG. 9A. On the other hand, when the characteristics of the transistor 160 have priority, the sidewall insulating layer may be formed on a side surface of the gate electrode 110 and the impurity regions 120 may include a region having a different impurity concentration.

As illustrated in FIG. 9A, the transistor 162 includes the wide-gap semiconductor and has a trench structure. In this embodiment, as the wide-gap semiconductor, the oxide semiconductor layer 144 is used. Here, the oxide semiconductor layer 144 is preferably highly purified. By using a highly purified oxide semiconductor, the transistor 162 which has extremely favorable off-state current characteristics can be obtained.

An insulating layer 152 having a single-layer or stacked-layer structure is provided over the transistor 162. Further, a conductive layer 153 is provided in a region overlapping with the source electrode 142a of the transistor 162 with the insulating layer 152 interposed therebetween; the source electrode 142a, the insulating layer 152, and the conductive layer 153 constitutes a capacitor 164. That is, the source electrode 142a of the transistor 162 functions as one electrode of the capacitor 164, and the conductive layer 153 functions as the other electrode of the capacitor 164. Note that the capacitor 164 may be omitted if a capacitor is not needed. Further, the capacitor 164 may be separately provided above the transistor 162. For example, a trench-type capacitor or a stack-type capacitor may be separately formed above the transistor 162 or below the transistor 160 so as to be three-dimensionally stacked, whereby the degree of integration may be further increased.

The insulating layer 152 is provided over the transistor 162 and the capacitor 164. Further, a wiring 156 for connecting the transistor 162 to another transistor is provided over the insulating layer 152. The wiring 156 is electrically connected to the drain electrode 142b through the electrode 154 provided in an opening which is provided in the insulating layers 150 and 152 or the like. Here, the electrode 154 is preferably provided so as to overlap with at least part of the oxide semiconductor layer 144 of the transistor 162.

In FIGS. 9A and 9B, the transistor 160 is provided so as to overlap with at least part of the transistor 162. The source region or the drain region of the transistor 160 is preferably provided so as to overlap with part of the oxide semiconductor layer 144. Further, the transistor 162 and the capacitor 164 are provided so as to overlap with at least part of the transistor 160. For example, the conductive layer 153 of the capacitor 164 is provided so as to overlap with at least part of the gate electrode 128 of the transistor 160. With such a planar layout, the area occupied by the semiconductor device can be reduced; thus, higher integration can be achieved.

Note that although the metal compound region 124, the drain electrode 142b, and the wiring 156 are connected to one another through the electrode 126 and the electrode 154 in FIG. 9A, the disclosed invention is not limited thereto. For example, the drain electrode 142b may be in direct contact with the metal compound region 124. Alternatively, the wiring 156 may be in direct contact with the drain electrode 142b.

Next, an example of a circuit configuration corresponding to FIGS. 9A and 9B is illustrated in FIG. 9C.

In FIG. 9C, a first wiring (a 1st Line) is electrically connected to a source electrode of the transistor 160. A second wiring (a 2nd Line) is electrically connected to a drain electrode of the transistor 160. A third wiring (a 3rd Line) is electrically connected to the other of the source electrode and the drain electrode of the transistor 162, and a fourth wiring (a 4th Line) is electrically connected to a gate electrode of the transistor 162. The gate electrode of the transistor 160 and the one of the source electrode or the drain electrode of the transistor 162 are electrically connected to one electrode of the capacitor 164, and a fifth wiring (a 5th line) and the other electrode of the capacitor 164 are electrically connected to each other.

The semiconductor device in FIG. 9C utilizes a characteristic in which the potential of the gate electrode of the transistor 160 can be held, and can thus write, hold, and read data as follows.

Writing and holding of data will be described. First, the potential of the fourth line is set to a potential at which the transistor 162 is turned on, so that the transistor 162 is turned on. Accordingly, the potential of the third line is supplied to the gate electrode of the transistor 160 and the capacitor 164. That is, predetermined charge is given to the gate electrode of the transistor 160 (writing of data). Here, one of two kinds of charges providing different potentials (hereinafter referred to as a low-level charge and a high-level charge) is applied. After that, the potential of the fourth line is set to a potential at which the transistor 162 is turned off, so that the transistor 162 is turned off. Thus, the charge given to the gate electrode of the transistor 160 is held (holding of data).

Since the off-state current of the transistor 162 is extremely small, the charge of the gate electrode of the transistor 160 is held for a long time.

Next, reading of data will be described. By supplying an appropriate potential (reading potential) to the fifth line while a predetermined potential (constant potential) is supplied to the first line, the potential of the second line varies depending on the amount of charge held in the gate electrode of the transistor 160. This is because in general, when the transistor 160 is an n-channel transistor, an apparent threshold voltage $V_{th\_H}$ in the case where a high-level charge is given to the gate electrode of the transistor 160 is lower than an apparent threshold voltage $V_{th\_L}$ in the case where a low-level charge is given to the gate electrode of the transistor 160. Here, an apparent threshold voltage refers to the potential of the fifth line, which is needed to turn on the transistor 160. Thus, the potential of the fifth line is set to a potential $V_0$ intermediate between $V_{th\_H}$ and $V_{th\_L}$, whereby charge given to the gate electrode of the transistor 160 can be determined. For example, in the case where a high-level charge is given in writing, when the potential of the fifth wiring is set to $V_0$ ($>V_{th\_H}$), the transistor 160 is turned on. In the case where a low level charge is given in writing, even when the potential of the fifth wiring is set to $V_0$ ($<V_{th\_L}$), the transistor 160 remains in an off state. Therefore, the data held can be read by measuring the potential of the second wiring.

Note that in the case where memory cells are arrayed to be used, data of only desired memory cells needs to be able to be read. In the case where such reading is not performed, a potential at which the transistor 160 is turned off, that is, a potential smaller than $V_{th\_H}$ may be given to the fifth wiring regardless of the state of the gate electrode of the transistor 160. Alternatively, a potential at which the transistor 160 is turned on, that is, a potential higher than $V_{th\_L}$ may be given to the fifth wiring regardless of the state of the gate electrode.

In the semiconductor device described in this embodiment, the transistor in which a wide-gap semiconductor (for example, an oxide semiconductor) is used for a channel formation region and in which the off-state current is extremely small is applied, whereby stored data can be held for an extremely long time. In other words, power consumption can be adequately reduced because refresh operation becomes unnecessary or the frequency of refresh operation can be sufficiently low. Moreover, stored data can be held for a long time even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

In addition, by employing the trench structure for the transistor 162, a reduction in the planar area of the transistor 162 can be achieved, so that higher integration can be achieved.

The structures, methods, and the like described in this embodiment can be combined as appropriate with any of the structures, methods, and the like described in the other embodiments.

Embodiment 3

In this embodiment, a semiconductor device which includes the transistor 162 described in Embodiment 1, which can hold stored data even when not powered, which does not have a limitation on the number of write cycles, and which has a structure different from the structure described in Embodiment 2, will be described with reference to FIGS. 10A and 10B and FIGS. 11A and 11B.

Figure 10A:
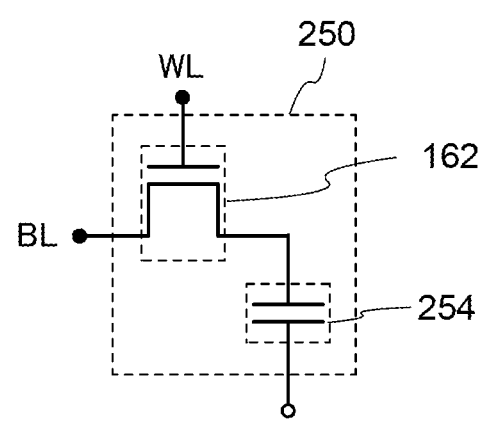
FIGS. 10A and 10B are a circuit diagram and a perspective view illustrating a semiconductor device of one embodiment of the present invention.
Figure 10B:
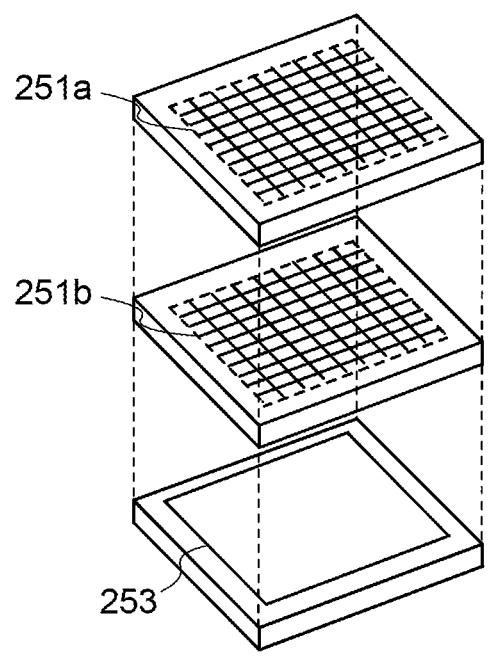

FIG. 10A illustrates an example of a circuit configuration of a semiconductor device, and FIG. 10B is a conceptual diagram illustrating an example of a semiconductor device. First, the semiconductor device illustrated in FIG. 10A will be described, and then, the semiconductor device illustrated in FIG. 10B will be described.

In the semiconductor device illustrated in FIG. 10A, a bit line BL is electrically connected to a source electrode or a drain electrode of the transistor 162, a word line WL is electrically connected to a gate electrode of the transistor 162, and a source electrode or a drain electrode of the transistor 162 is electrically connected to a first terminal of a capacitor 254.

The transistor 162 including an oxide semiconductor as a wide-gap semiconductor has extremely small off-state current. For that reason, a potential of the first terminal of the capacitor 254 (or a charge accumulated in the capacitor 254) can be held for an extremely long time by turning off the transistor 162. Further, in the transistor 162 including an oxide semiconductor as a wide-gap semiconductor, a short-channel effect is not likely to be caused, which is advantageous.

Next, writing and holding of data in the semiconductor device (a memory cell 250) illustrated in FIG. 10A will be described.

First, the potential of the word line WL is set to a potential at which the transistor 162 is turned on, and the transistor 162 is turned on. Accordingly, the potential of the bit line BL is supplied to the first terminal of the capacitor 254 (writing of data). After that, the potential of the word line WL is set to a potential at which the transistor 162 is turned off, so that the transistor 162 is turned off. Thus, the charge at the first terminal of the capacitor 254 is held (holding of data).

Because the off-state current of the transistor 162 is extremely small, the potential of the first terminal of the capacitor 254 (or the charge accumulated in the capacitor) can be held for a long time.

Secondly, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0 (=(C_B \times V_{B0} + C \times V_0)/(C_B + C))$.

Then, by comparing the potential of the bit line BL with a predetermined potential, data can be read.

As described above, the semiconductor device illustrated in FIG. 10A can hold charge that is accumulated in the capacitor 254 for a long time because the off-state current of the transistor 162 is extremely small. In other words, power consumption can be sufficiently reduced because refresh operation becomes unnecessary or the frequency of refresh operation can be extremely low. Moreover, stored data can be stored for a long time even when power is not supplied.

Next, the semiconductor device illustrated in FIG. 10B will be described.

The semiconductor device illustrated in FIG. 10B includes memory cell arrays 251a and 251b including a plurality of memory cells 250 illustrated in FIG. 10A as a memory circuit in an upper portion, and a peripheral circuit 253 in a lower portion which is necessary for operation of the memory cell array 251 (the memory cell arrays 251a and 251b). Note that the peripheral circuit 253 is electrically connected to the memory cell array 251.

In the structure illustrated in FIG. 10B, the peripheral circuit 253 can be provided under the memory cell array 251 (the memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 10B illustrates, as an example, the semiconductor device in which two memory cell arrays 251 (the memory cell arrays 251a and 251b) are stacked; however, the number of memory cells to be stacked is not limited thereto. Three or more memory cells may be stacked.

Next, a specific structure of the memory cell 250 illustrated in FIG. 10A will be described with reference to FIGS. 11A and 11B.

Figure 11A:
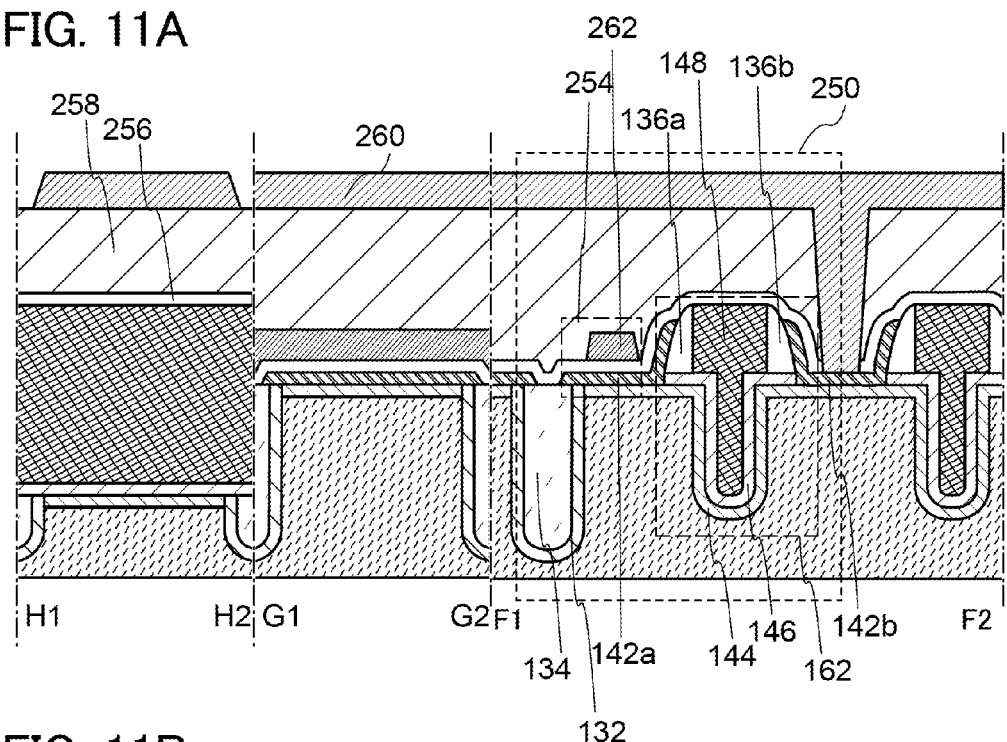
FIGS. 11A and 11B are a cross-sectional view and a plan view illustrating a semiconductor device of one embodiment of the present invention.
Figure 11B:
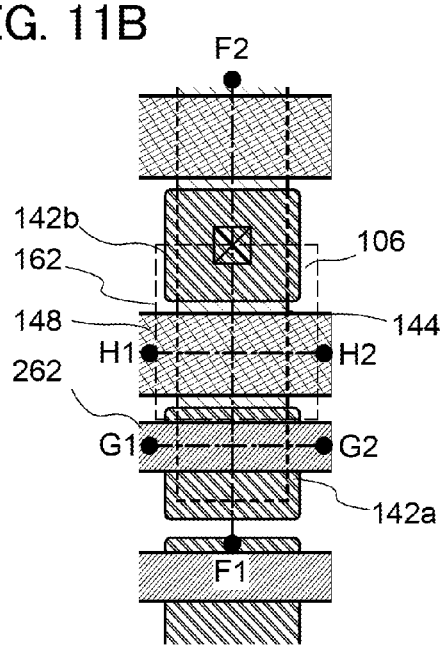

FIGS. 11A and 11B illustrate an example of a structure of the memory cell 250. FIG. 11A illustrates cross-sections of the memory cell 250, and FIG. 11B is a plan view of the memory cell 250. Here, FIG. 11A illustrates cross sections taken along the chain line F1-F2, the chain line G1-G2, and the chain line H1-H2 in FIG. 11B.

The structure of the transistor 162 illustrated in FIGS. 11A and 11B is the same as that described in Embodiment 1; thus, for description of FIGS. 11A and 11B, the same reference numerals are used for the same parts as those in FIGS. 1A1 and 1A2.

An insulating layer 256 having a single-layer or stacked-layer structure is provided over the transistor 162. Further, a conductive layer 262 is provided in a region overlapping with the source electrode 142a of the transistor 162 with the insulating layer 256 interposed therebetween; the source electrode 142a, the insulating layer 256, and the conductive layer 262 constitutes a capacitor 254. That is, the source electrode 142a of the transistor 162 functions as one electrode of the capacitor 254, and the conductive layer 262 functions as the other electrode of the capacitor 254.

An insulating layer 258 is provided over the transistor 162 and the capacitor 254. Further, a wiring 260 for connecting the memory cell 250 to an adjacent memory cell 250 is provided over the insulating layer 258. The wiring 260 is electrically connected to the drain electrode 142b of the transistor 162 through an opening which is provided in the insulating layers 256 and 258 or the like. Alternatively, another conductive layer is formed in the opening, and the wiring 260 may be electrically connected to the drain electrode 142b through the conductive layer. Note that the wiring 260 corresponds to the bit line BL in the circuit diagram of FIG. 10A.

In FIGS. 11A and 11B, the drain electrode 142b of the transistor 162 also functions as a source electrode of the transistor included in the adjacent memory cell. With such a planar layout, the area occupied by the semiconductor device can be reduced; thus, higher integration can be achieved.

As described above, the plurality of memory cells formed in multiple layers in the upper portion is each formed with a transistor including an oxide semiconductor as a wide-gap semiconductor layer. Since the off-state current of the transistor including an oxide semiconductor as a wide-gap semiconductor layer is small, stored data can be held for a long time owing to such a transistor. In other words, power consumption can be sufficiently reduced because the frequency of refresh operation can be extremely low.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

This embodiment can be implemented in appropriate combination with the structures described in the other embodiments.

Embodiment 4

In this embodiment, examples of application of the semiconductor device described in any of the above embodiments to portable devices such as cellular phones, smartphones, or e-book readers will be described with reference to FIGS. 12A and 12B, FIG. 13, FIG. 14, and FIG. 15.

In portable electronic devices such as a cellular phone, a smartphone, and an e-book reader, an SRAM or a DRAM is used so as to store image data temporarily. The reason why an SRAM or a DRAM is used is that a flash memory is slow in responding and is not suitable for image processing. However, an SRAM and a DRAM have the following feature when an SRAM or a DRAM is used for storing image data temporarily.

Figure 12A:
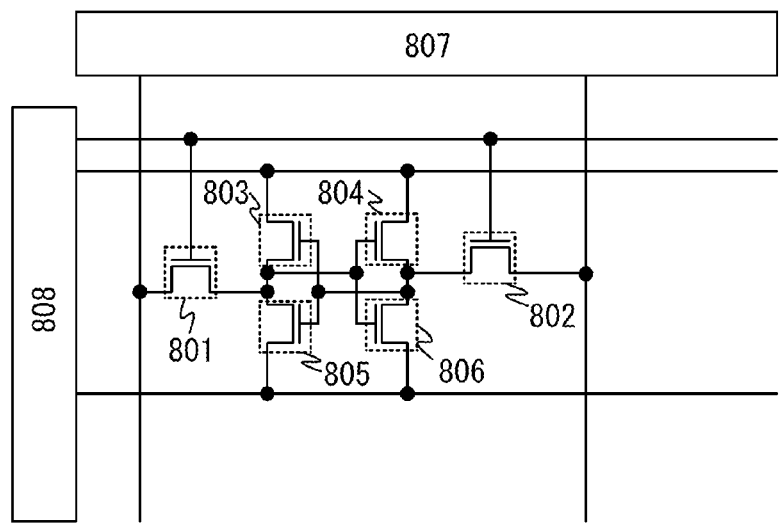
FIGS. 12A and 12B are circuit diagrams illustrating a semiconductor device of one embodiment of the present invention.

In a normal SRAM, as shown in FIG. 12A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 12B:
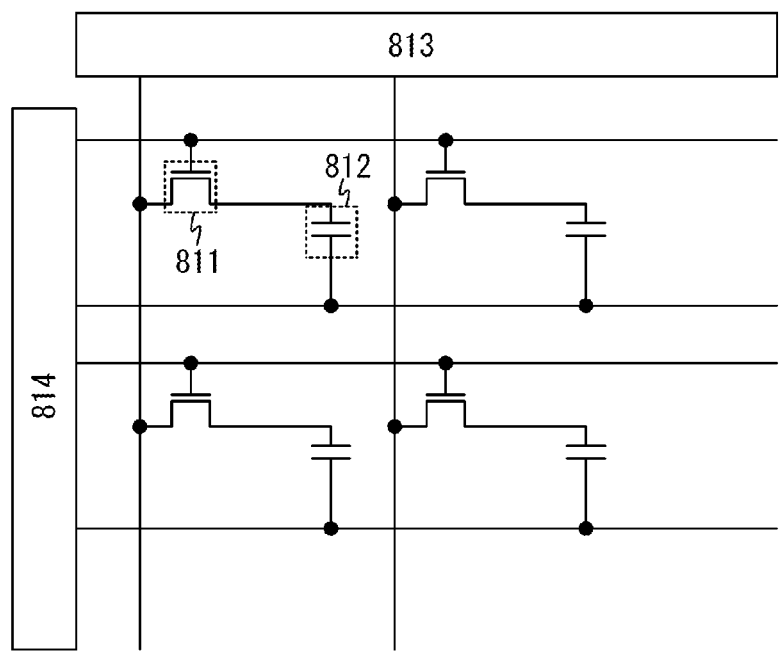

On the other hand, as shown in FIG. 12B, a memory cell in a DRAM includes a transistor 811 and a storage capacitor 812, and is driven by an X decoder 813 and a Y decoder 814. One cell includes one transistor and one capacitor and thus the area of a memory cell is small. The area of a memory cell of a DRAM is generally less than or equal to 10 $F^2$. Note that the DRAM needs to be refreshed periodically and consumes electric power even when a rewriting operation is not performed.

However, the area of the memory cell of the semiconductor device described the above embodiments is about 10 $F^2$ and frequent refreshing is not needed. Therefore, the area of the memory cell is reduced, and the power consumption can be reduced.

Figure 13:
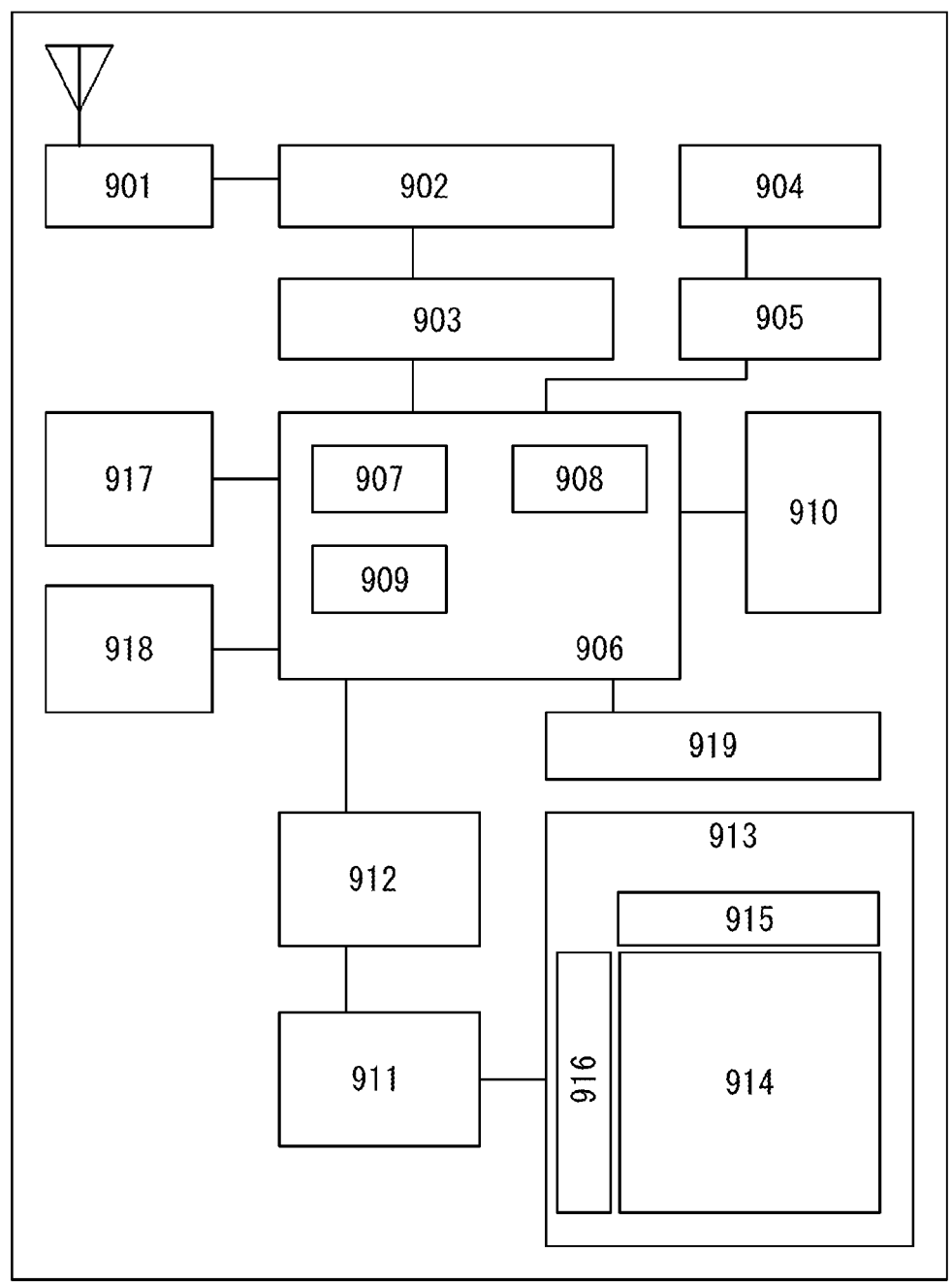
FIG. 13 is a block diagram illustrating a semiconductor device of one embodiment of the present invention.

Next, a block diagram of a portable device is illustrated in FIG. 13. A portable device shown in FIG. 13 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 14:
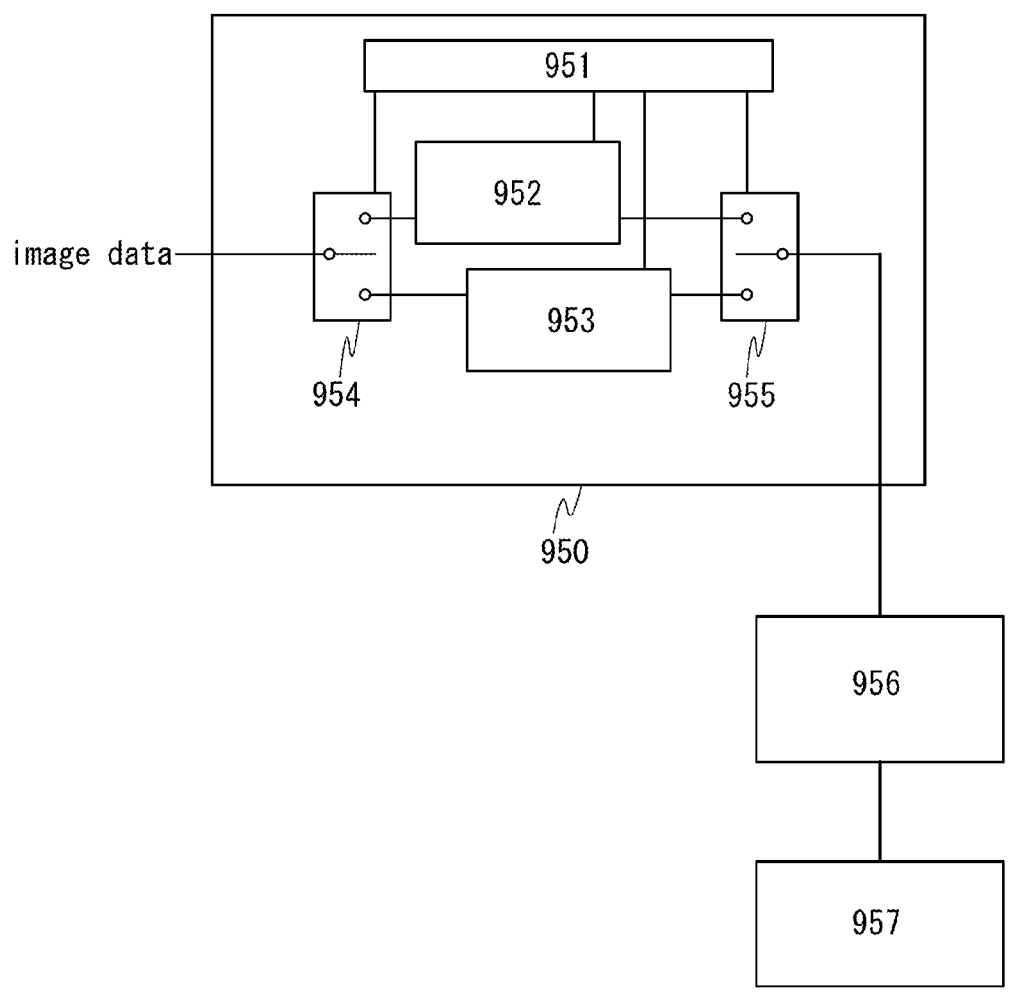
FIG. 14 is a block diagram illustrating a semiconductor device of one embodiment of the present invention.

Next, FIG. 14 shows an example in which the semiconductor device described in any of the above embodiments is used for a memory circuit 950 in a display. The memory circuit 950 illustrated in FIG. 14 includes a memory 952, a memory 953, a switch 954, a switch 955, and a memory controller 951. Further, in the memory circuit, a signal line from image data (input image data), a display controller 956 which reads and controls data held in the memories 952 and 953, and a display 957 which displays data by a signal from the display controller 956 are connected.

First, image data (input image data A) is formed by an application processor (not shown). The input image data A is held in the memory 952 through the switch 954. Then, the image data stored in the memory 952 (stored image data A) is transmitted to the display 957 through the switch 955 and the display controller 956, and is displayed on the display 957.

In the case where the input image data A is not changed, the stored image data A is read from the display controller 956 through the memory 952 and the switch 955 with a frequency of 30 Hz to 60 Hz in general.

Next, for example, when a user performs an operation to rewrite a screen (i.e., when the input image data A is changed), the application processor produces new image data (input image data B). The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 15:
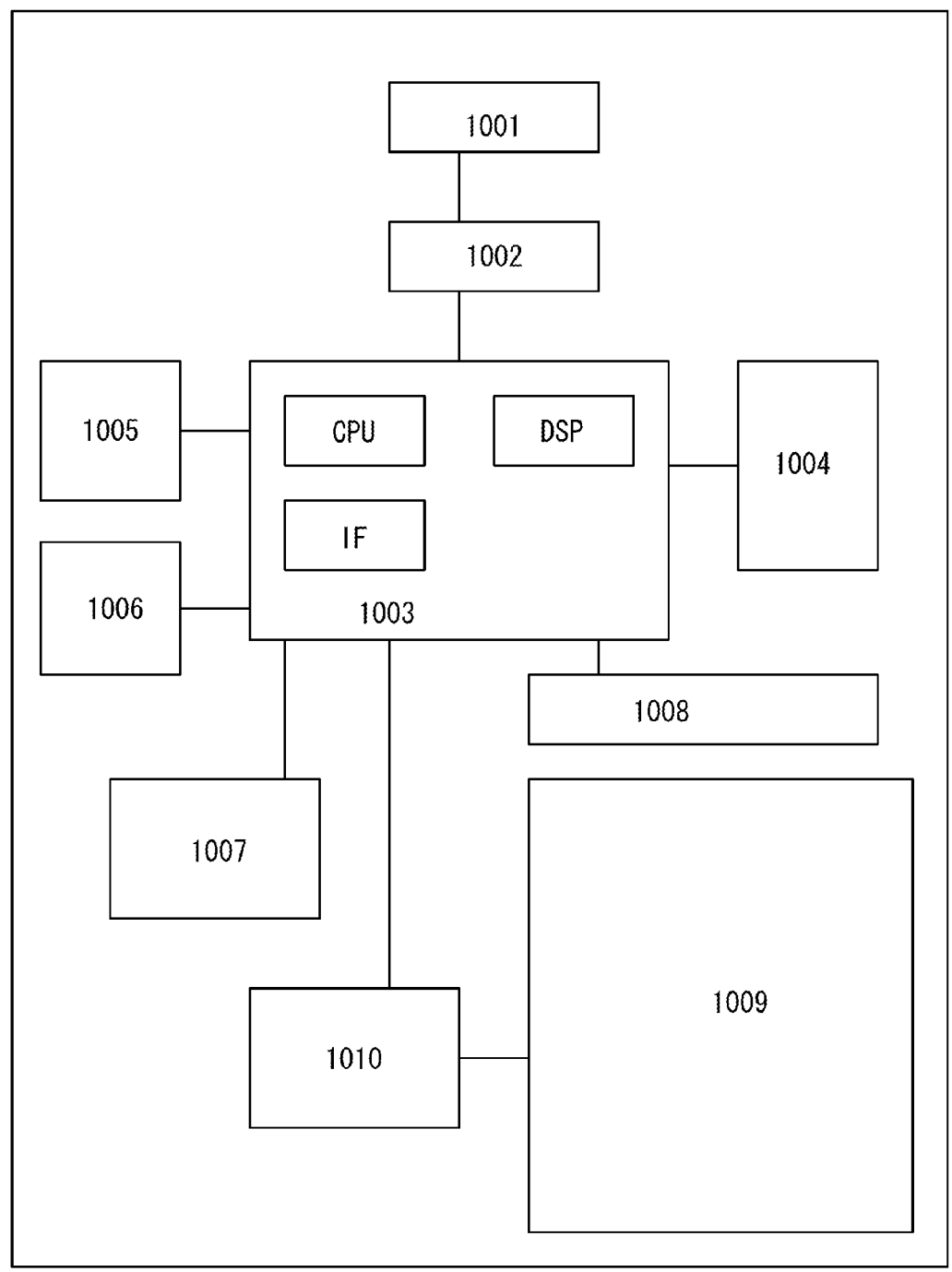
FIG. 15 is a block diagram illustrating a semiconductor device of one embodiment of the present invention.

Next, FIG. 15 shows a block diagram of an e-book reader. FIG. 15 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 15. The memory circuit 1007 has a function of temporarily storing the contents of a book. For example, a user may use a highlight function. In some cases, a user wants to mark a specific portion while reading an e-book reader. This marking function is called highlight function and is used to make a difference from the other portions by changing the display color, underlining, making characters bold, changing the font of characters, or the like. The function makes it possible to store and hold data of a portion specified by a user. In order to store the data for a long time, the data may be copied to the flash memory 1004. Even in such a case, by employing the semiconductor device described in any of the above embodiments, writing and reading of data can be performed at high speed, data can be held for a long time, and power consumption can be sufficiently reduced.

As described above, the portable devices described in this embodiment each incorporates the semiconductor device according to any of the above embodiments. Therefore, it is possible to obtain a portable device which is capable of reading data at high speed, holding data for a long time, and reducing power consumption.

The structures, methods, and the like described in this embodiment can be combined as appropriate with any of the structures, methods, and the like described in the other embodiments.

This application is based on Japanese Patent Application serial no. 2011-058341 filed with Japan Patent Office on Mar. 16, 2011, the entire contents of which are hereby incorporated by reference.

What is claimed is:

1. A semiconductor device comprising:
a first insulating layer;
a first trench and a second trench in the first insulating layer;
an oxide semiconductor layer over the first insulating layer;
a gate insulating layer over the oxide semiconductor layer;
a gate electrode adjacent to the oxide semiconductor layer with the gate insulating layer interposed therebetween;
a first sidewall insulating layer and a second sidewall insulating layer in contact with the gate electrode;
a source electrode over the first sidewall insulating layer; and
a drain electrode over the second sidewall insulating layer,
wherein at least part of the oxide semiconductor layer is formed in the first trench,
wherein at least part of the gate insulating layer is formed in the first trench,
wherein at least part of the gate electrode is formed in the first trench,
wherein the source electrode and the drain electrode are in electrical contact with the oxide semiconductor layer, and
wherein a depth of the second trench is deeper than a depth of the first trench.

2. The semiconductor device according to claim 1, wherein the first trench is located between the source electrode and the drain electrode.

3. The semiconductor device according to claim 1, wherein the first trench is filled with the oxide semiconductor layer, the gate insulating layer, and the gate electrode.

4. The semiconductor device according to claim 1,
wherein a second insulating layer is provided in contact with the second trench,
wherein a third insulating layer is provided in contact with the second insulating layer, and
wherein the second trench is filled with the second insulating layer and the third insulating layer.

5. The semiconductor device according to claim 1,
wherein the source electrode is provided in contact with the first sidewall insulating layer, and
wherein the drain electrode is provided in contact with the second sidewall insulating layer.

6. The semiconductor device according to claim 4, wherein each of the source electrode and the drain electrode is provided so as to overlap with at least part of the third insulating layer.

7. The semiconductor device according to claim 4,
wherein a stack of a silicon oxide film and an aluminum oxide film is provided as the second insulating layer, and
wherein the silicon oxide film is in contact with the oxide semiconductor layer.

8. The semiconductor device according to claim 1, further comprising a capacitor,
wherein one of the source electrode and the drain electrode is electrically connected to one electrode of the capacitor.

9. A semiconductor device comprising a plurality of memory cells each including a first trench, a second trench, a transistor, and a capacitor,
wherein the first trench and the second trench are provided in a first insulating layer,
wherein the transistor includes:
an oxide semiconductor layer over the first insulating layer;
a gate insulating layer over the oxide semiconductor layer;
a gate electrode adjacent to the oxide semiconductor layer with the gate insulating layer interposed therebetween;
a first sidewall insulating layer and a second sidewall insulating layer in contact with the gate electrode;
a source electrode over the first sidewall insulating layer; and
a drain electrode over the second sidewall insulating layer,
wherein at least part of the oxide semiconductor layer is formed in the first trench, wherein at least part of the gate insulating layer is formed in the first trench, wherein at least part of the gate electrode is formed in the first trench, wherein the source electrode and the drain electrode are in electrical contact with the oxide semiconductor layer, wherein a depth of the second trench is deeper than a depth of the first trench, and wherein one of the source electrode and the drain electrode is electrically connected to one electrode of the capacitor.

10. The semiconductor device according to claim 9, wherein the first trench is located between the source electrode and the drain electrode.

11. The semiconductor device according to claim 9, wherein the first trench is filled with the oxide semiconductor layer, the gate insulating layer, and the gate electrode.

12. The semiconductor device according to claim 9, wherein a second insulating layer is provided in contact with the second trench, wherein a third insulating layer is provided in contact with the second insulating layer, and wherein the second trench is filled with the second insulating layer and the third insulating layer.

13. The semiconductor device according to claim 9, wherein the source electrode is provided in contact with the first sidewall insulating layer, and wherein the drain electrode is provided in contact with the second sidewall insulating layer.

14. The semiconductor device according to claim 12, wherein each of the source electrode and the drain electrode is provided so as to overlap with at least part of the third insulating layer.

15. The semiconductor device according to claim 12, wherein a stack of a silicon oxide film and an aluminum oxide film is provided as the second insulating layer, and wherein the silicon oxide film is in contact with the oxide semiconductor layer.

16. A semiconductor device comprising a plurality of memory cells each including a first trench, a second trench, a first transistor, a second transistor, and a capacitor, wherein the first trench and the second trench are provided in a first insulating layer, wherein the first transistor includes a channel formation region, a source region, a drain region, a first gate insulating layer, and a first gate electrode, wherein the second transistor includes:

an oxide semiconductor layer over the first insulating layer;

a second gate insulating layer over the oxide semiconductor layer;

a second gate electrode adjacent to the oxide semiconductor layer with the second gate insulating layer interposed therebetween; and a first sidewall insulating layer and a second sidewall insulating layer in contact with the second gate electrode;

a source electrode over the first sidewall insulating layer; and a drain electrode over the second sidewall insulating layer, wherein at least part of the oxide semiconductor layer is formed in the first trench, wherein at least part of the second gate insulating layer is formed in the first trench, wherein at least part of the second gate electrode is formed in the first trench, wherein the source electrode and the drain electrode are in electrical contact with the oxide semiconductor layer, wherein the first transistor is provided so as to overlap with at least part of the second transistor, wherein a depth of the second trench is deeper than a depth of the first trench, and wherein one of the source electrode and the drain electrode is electrically connected to one electrode of the capacitor and the first gate electrode.

17. The semiconductor device according to claim 16, wherein the first trench is located between the source electrode and the drain electrode.

18. The semiconductor device according to claim 16, wherein the first trench is filled with the oxide semiconductor layer, the second gate insulating layer, and the second gate electrode.

19. The semiconductor device according to claim 16, wherein a second insulating layer is provided in contact with the second trench, wherein a third insulating layer is provided in contact with the second insulating layer, and wherein the second trench is filled with the second insulating layer and the third insulating layer.

20. The semiconductor device according to claim 16, wherein the source electrode is provided in contact with the first sidewall insulating layer, and wherein the drain electrode is provided in contact with the second sidewall insulating layer.

21. The semiconductor device according to claim 19, wherein each of the source electrode and the drain electrode is provided so as to overlap with at least part of the third insulating layer.

22. The semiconductor device according to claim 19, wherein a stack of a silicon oxide film and an aluminum oxide film is provided as the second insulating layer, and wherein the silicon oxide film is in contact with the oxide semiconductor layer.

* * * * *